(12) United States Patent
Liu et al.

(10) Patent No.: US 8,999,777 B2
(45) Date of Patent: Apr. 7, 2015

(54) METHOD OF CONDUCTING A DIRECTION-SPECIFIC TRIMMING PROCESS FOR CONTACT PATTERNING

(71) Applicant: Taiwan Semiconductor Manufacturing Company Ltd., Hsin-Chu (TW)

(72) Inventors: Ming Chyi Liu, Hsinchu (TW); Shih-Chang Liu, Kaohsiung County (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/803,350

(22) Filed: Mar. 14, 2013

(65) Prior Publication Data
US 2014/0273424 A1    Sep. 18, 2014

(51) Int. Cl.
*H01L 29/16* (2006.01)
*H01L 21/28* (2006.01)

(52) U.S. Cl.
CPC .................. *H01L 21/28008* (2013.01)

(58) Field of Classification Search
USPC .......... 438/157, 176, 283, 734–739; 257/E21.623, E21.637
See application file for complete search history.

(56) References Cited

U.S. PATENT DOCUMENTS 7,662,718 B2 *   2/2010   Abatchev et al. ............. 438/689
8,153,527 B2 *   4/2012   Loh et al. ...................... 438/695

* cited by examiner

*Primary Examiner* — Thanhha Pham
(74) *Attorney, Agent, or Firm* — Haynes and Boone, LLP

(57) ABSTRACT

The present disclosure discloses a method of fabricating a semiconductor device. A first layer is formed over a substrate. A patterned second layer is then formed over the first layer. The patterned second layer includes an opening. A spacer material is then deposited in the opening, thereby reducing the opening in a plurality of directions. A direction-specific trimming process is performed to the spacer material and the second layer. Thereafter, the first layer is patterned with the second layer.

20 Claims, 23 Drawing Sheets

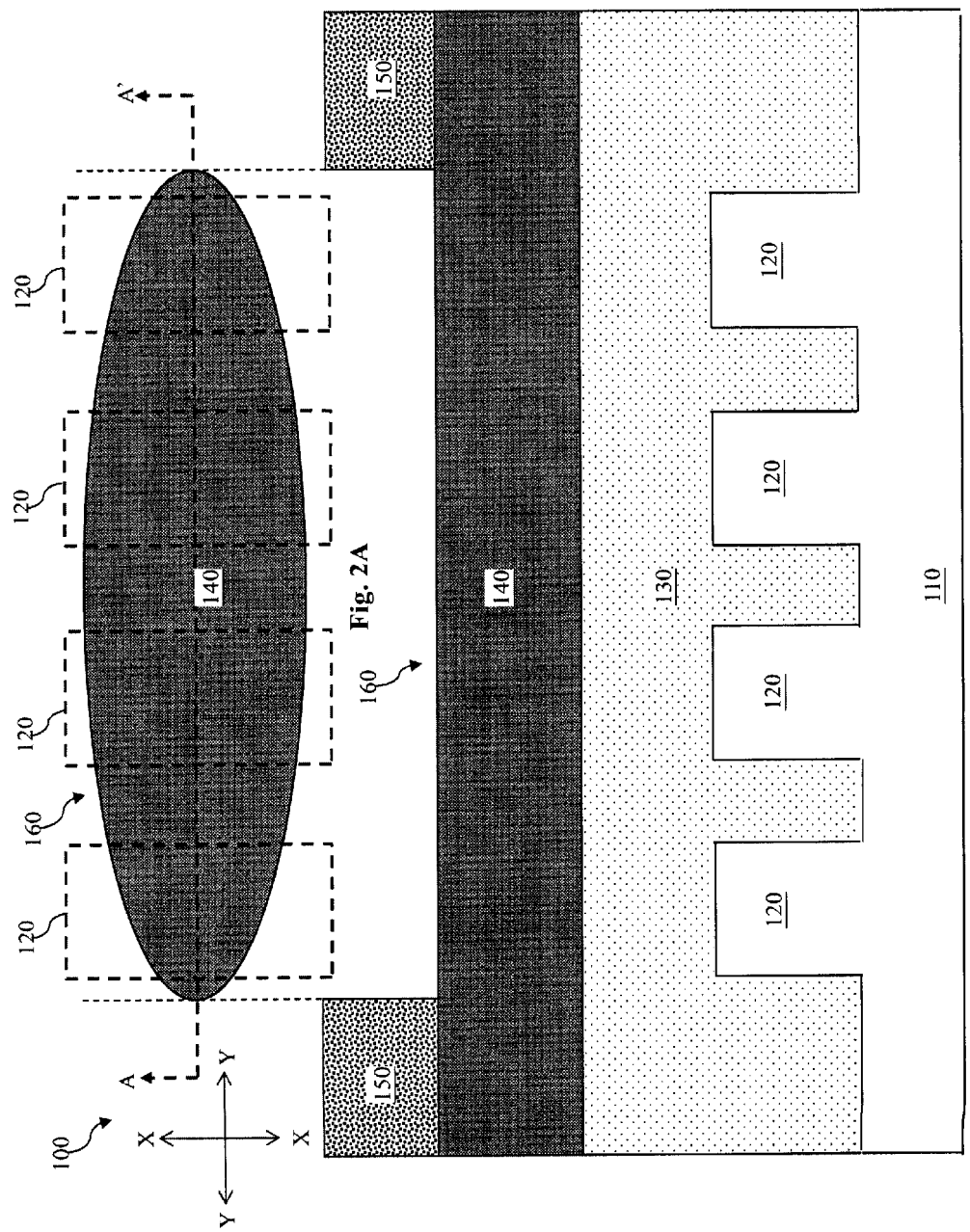

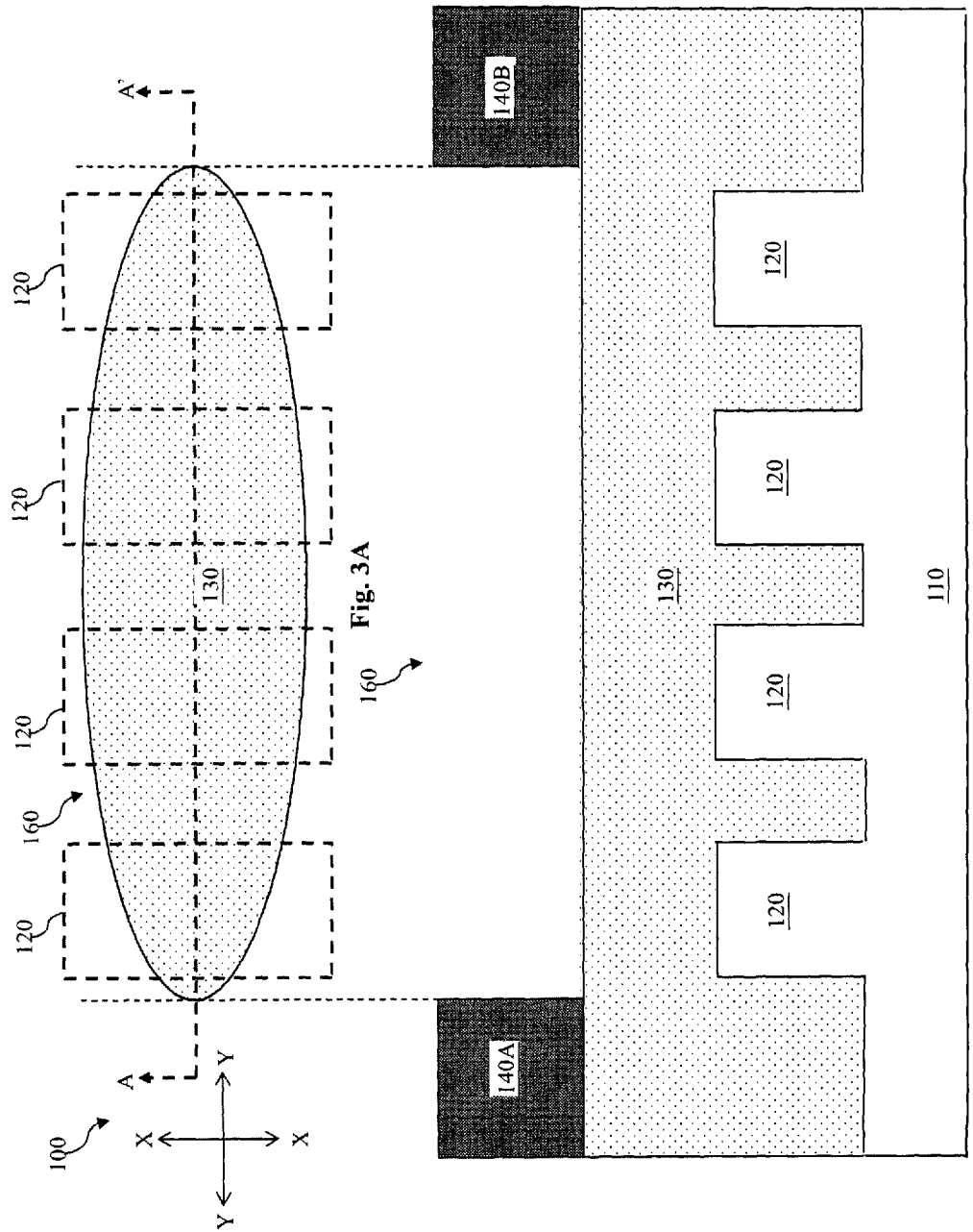

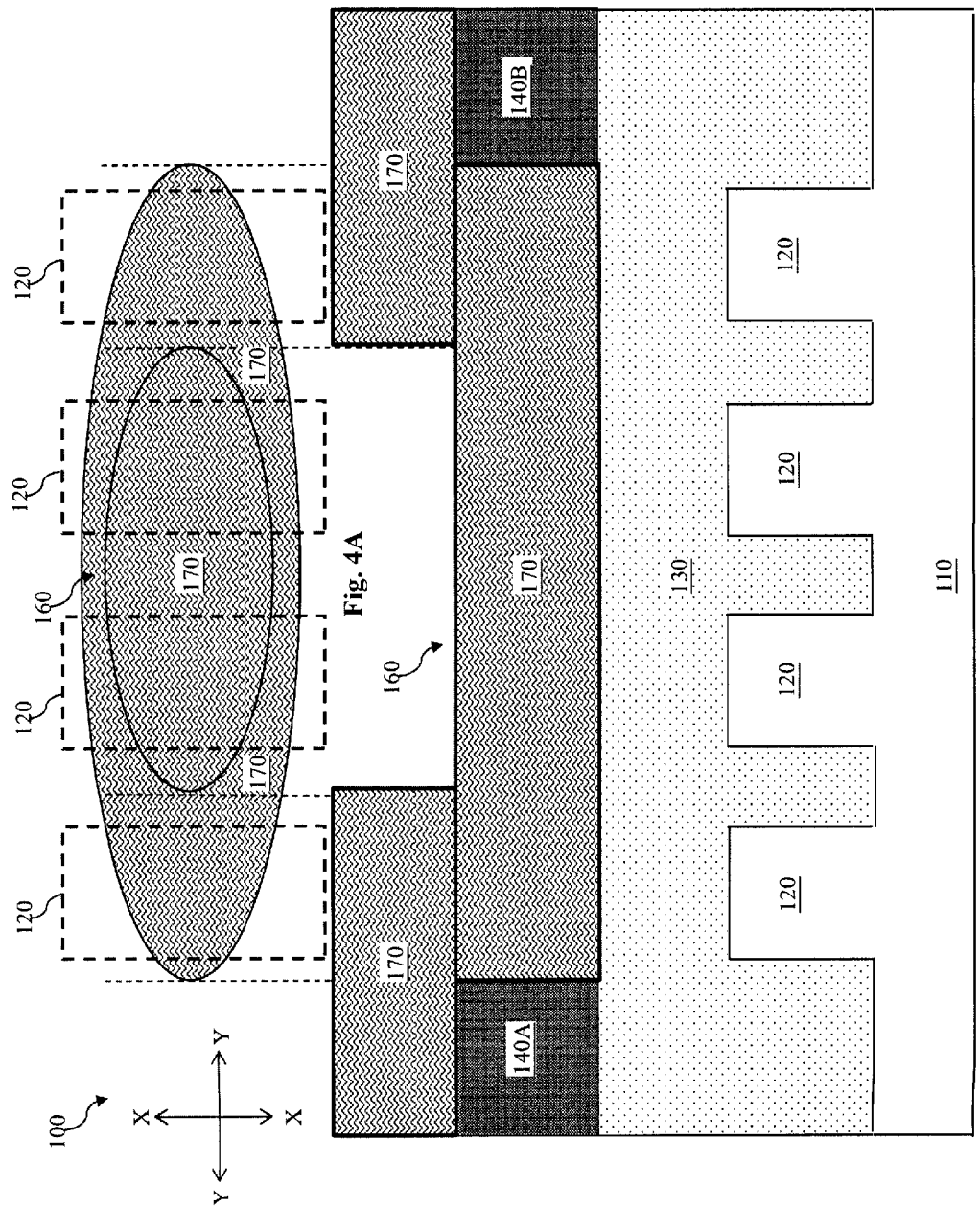

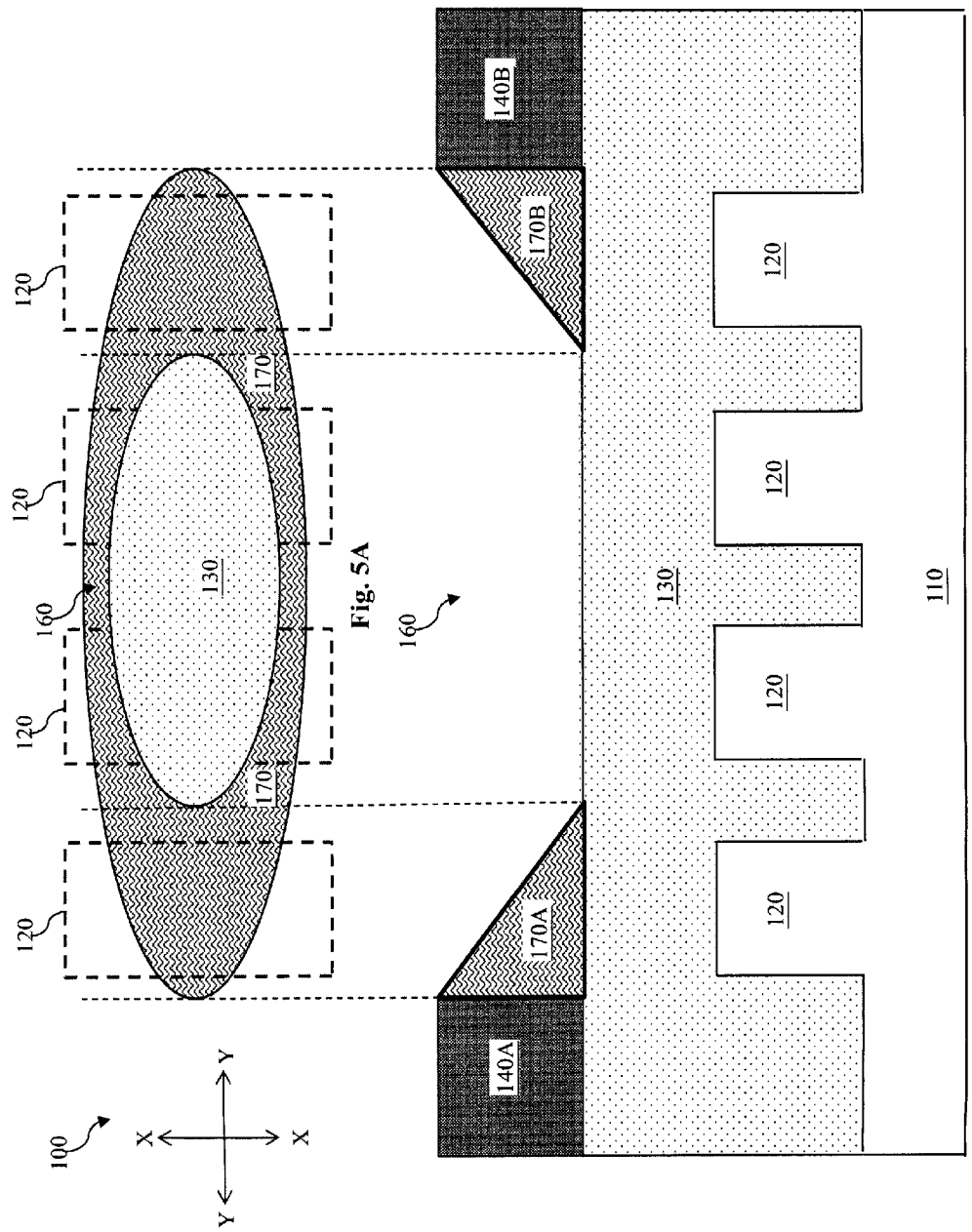

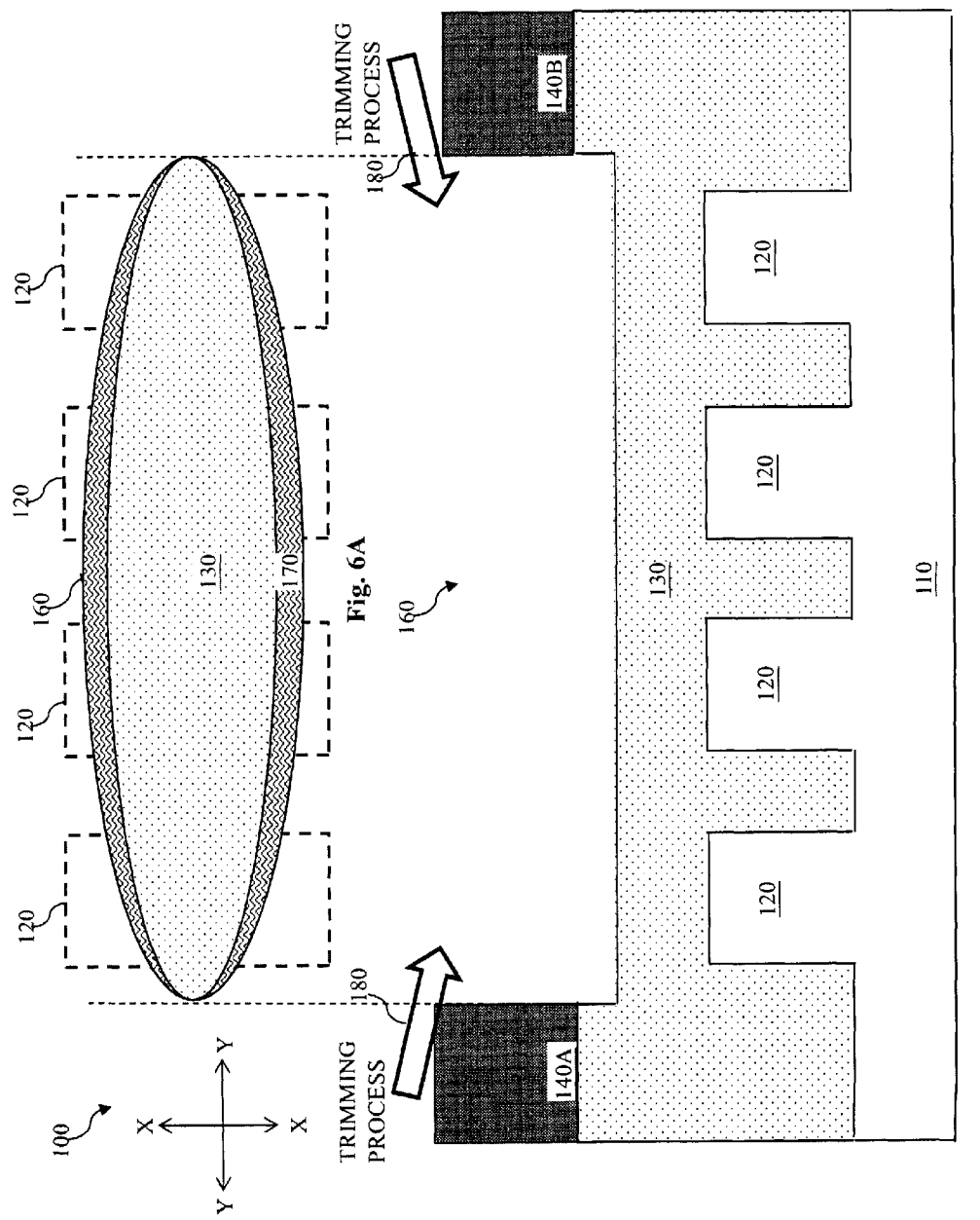

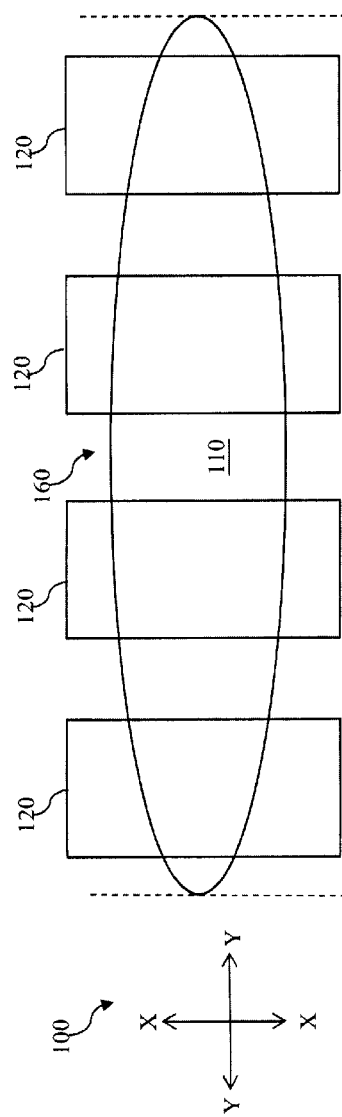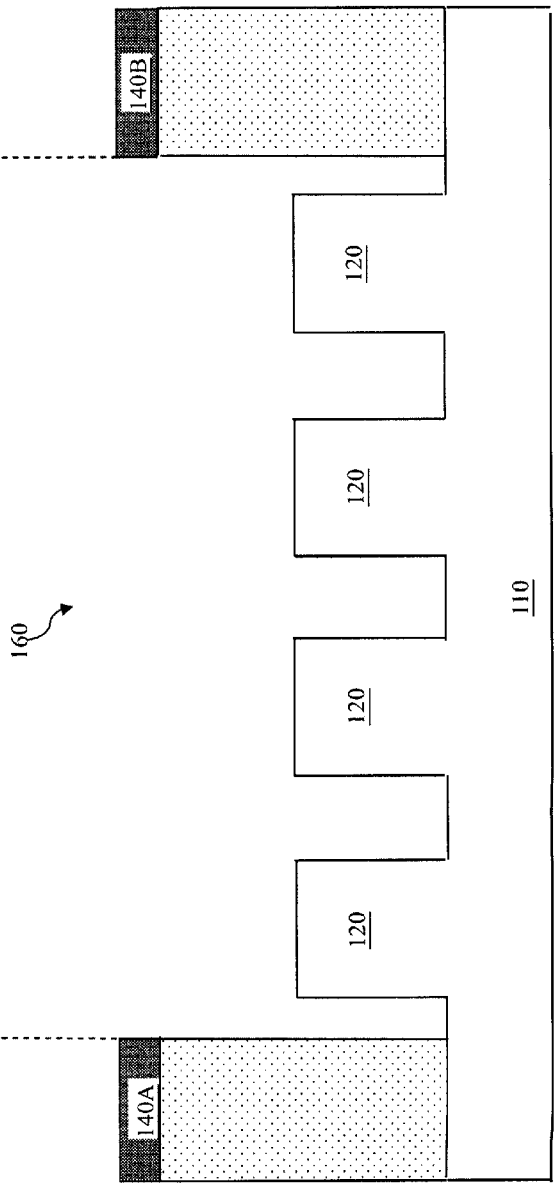

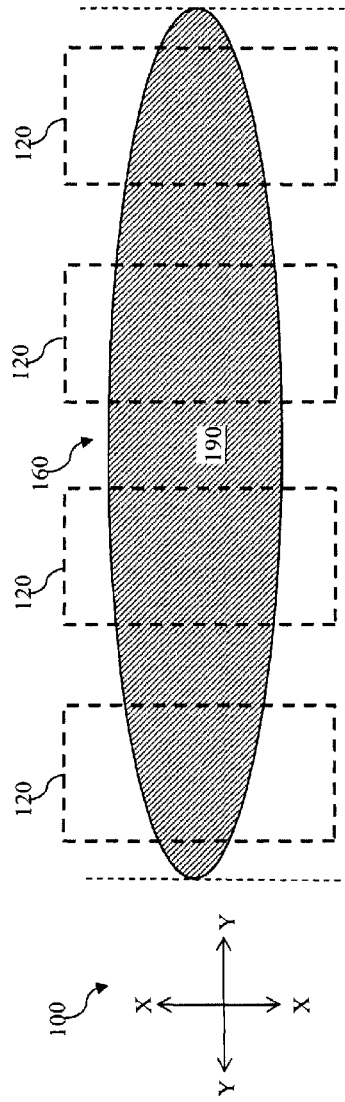
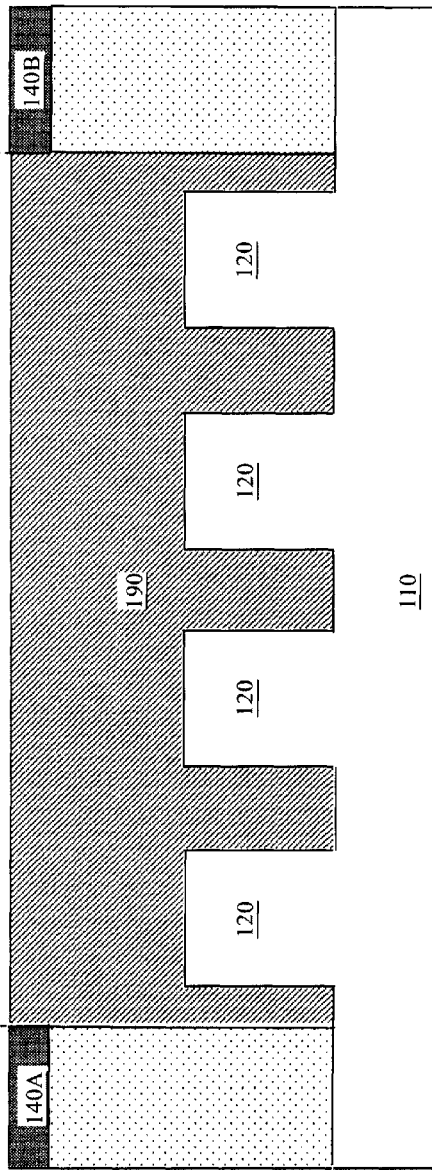
Fig. 8A
Fig. 8B

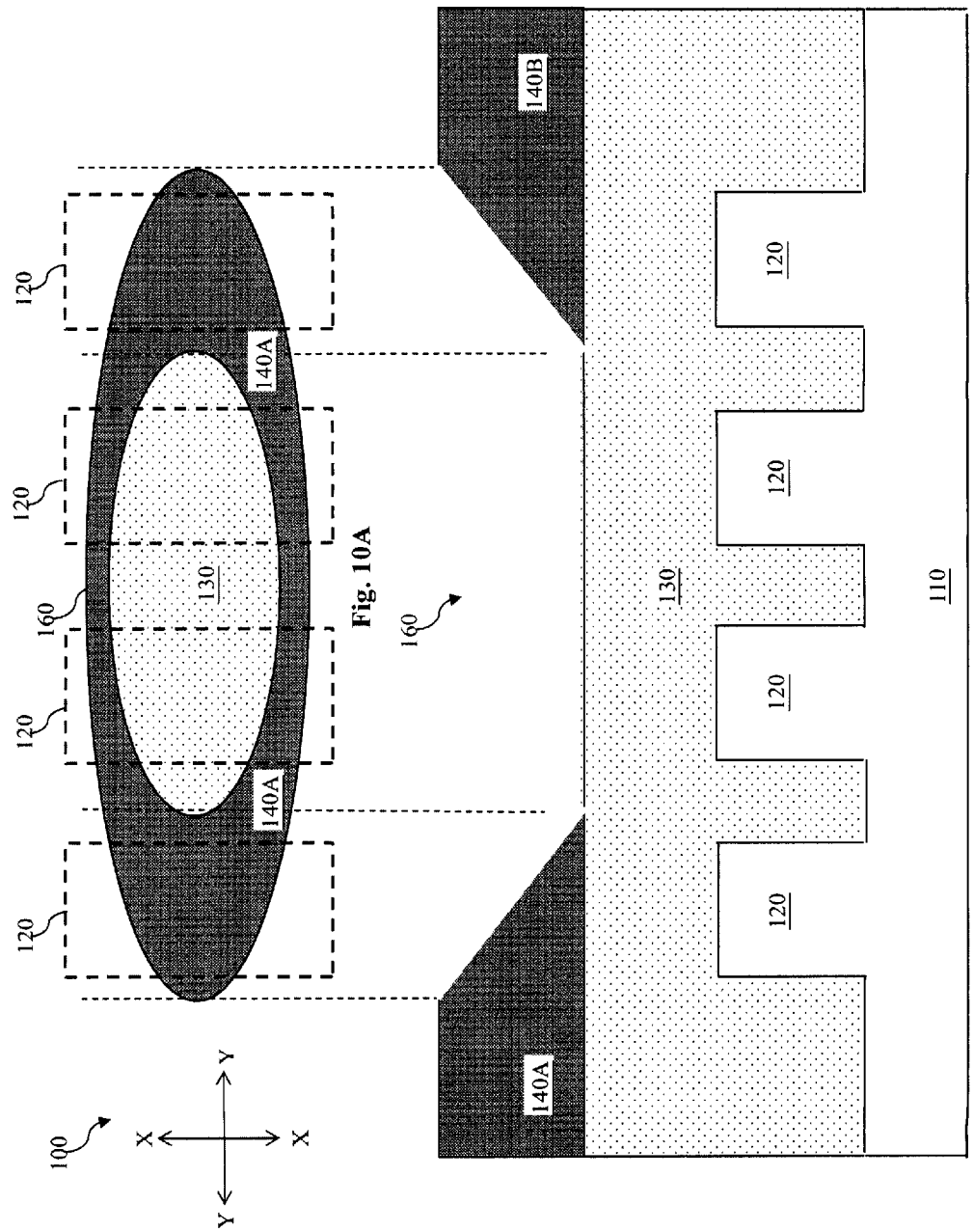

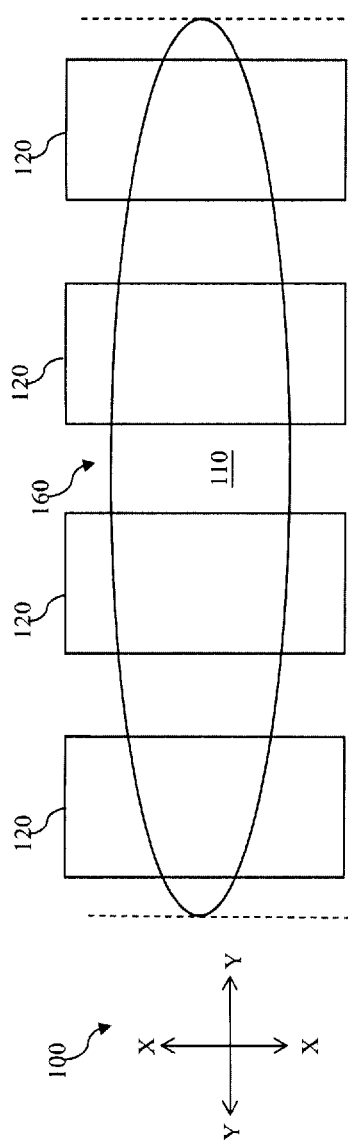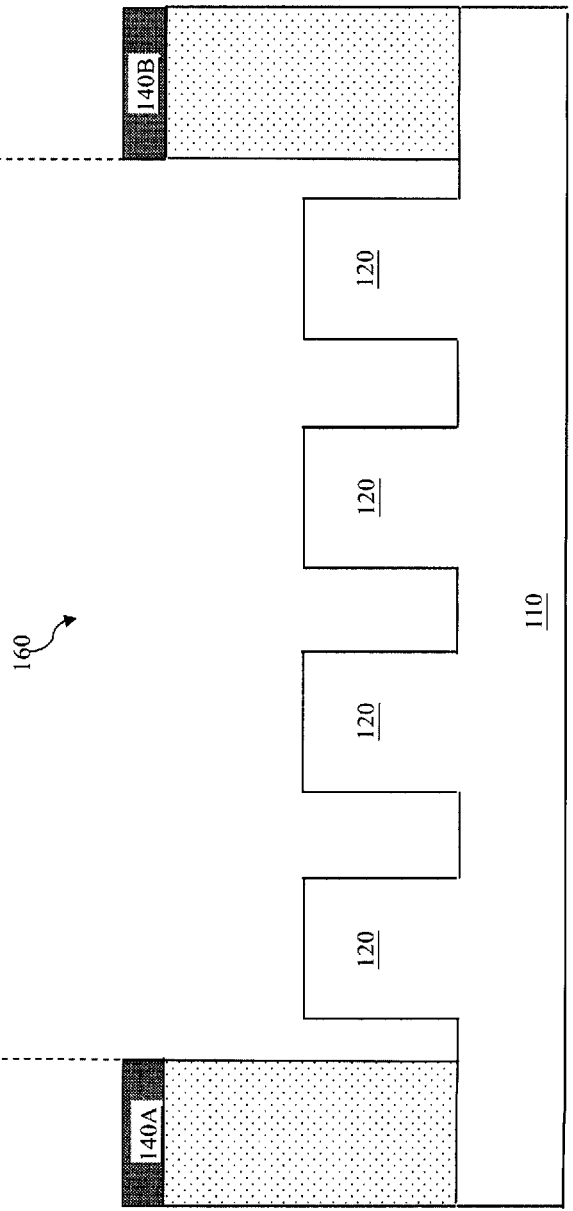

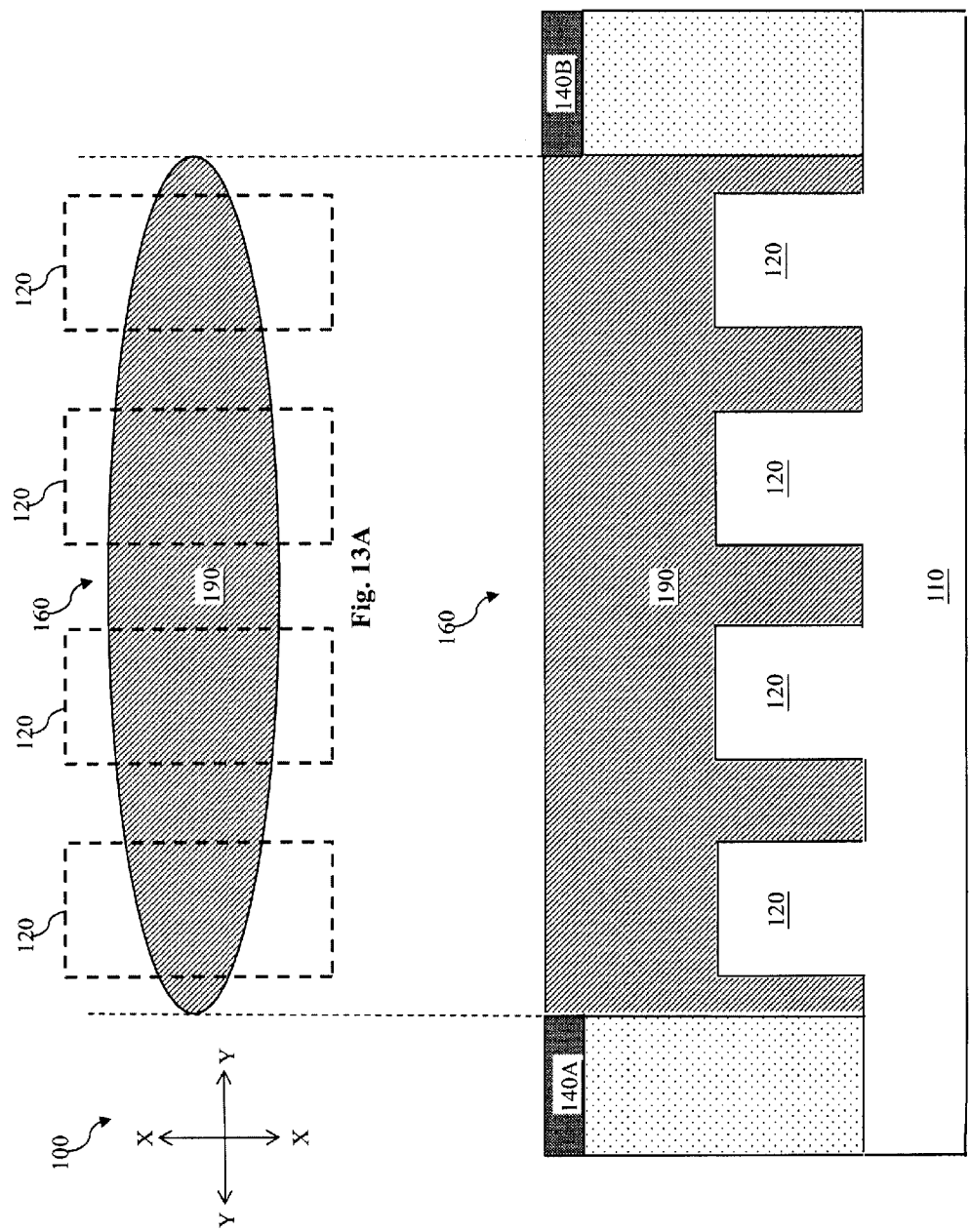

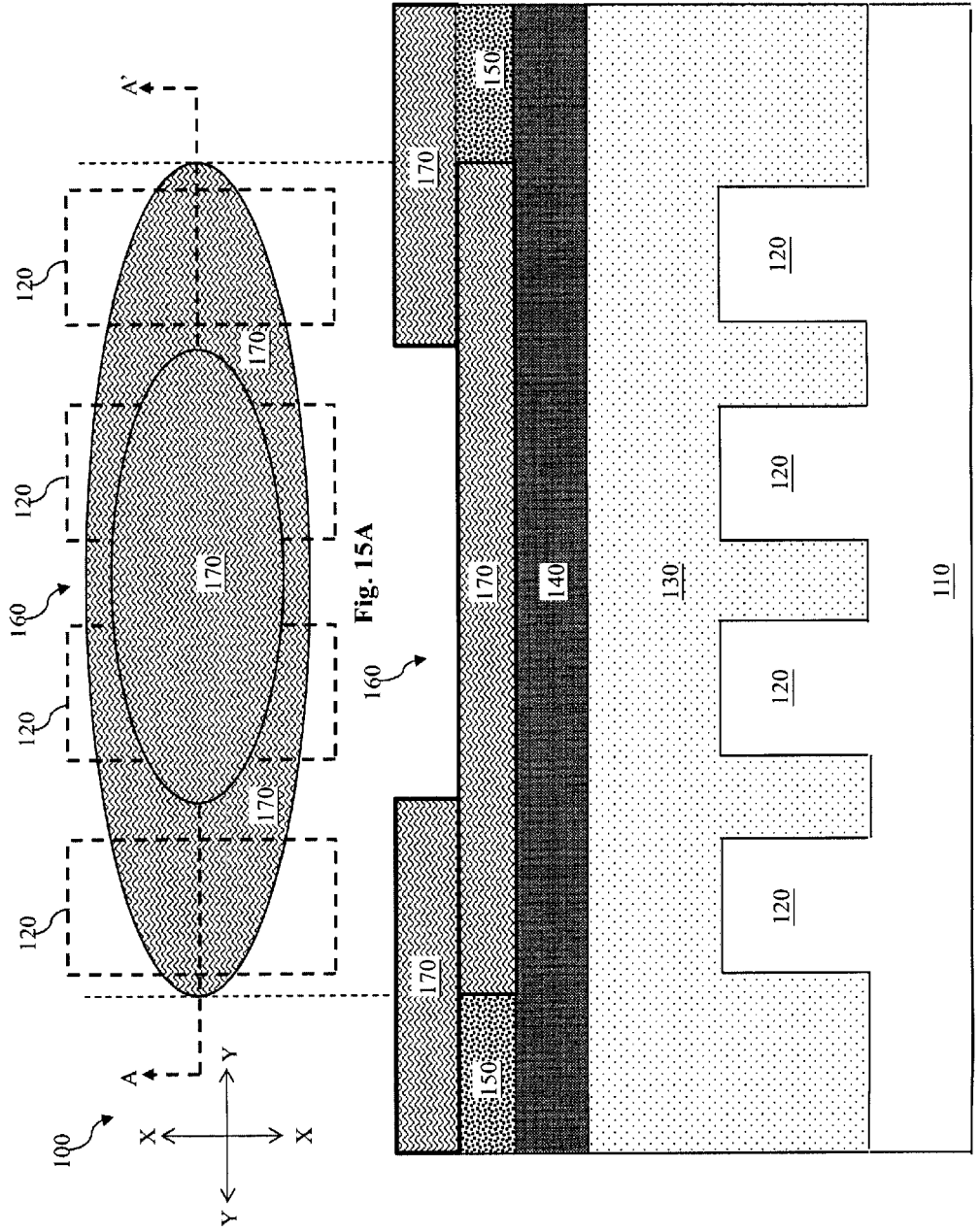

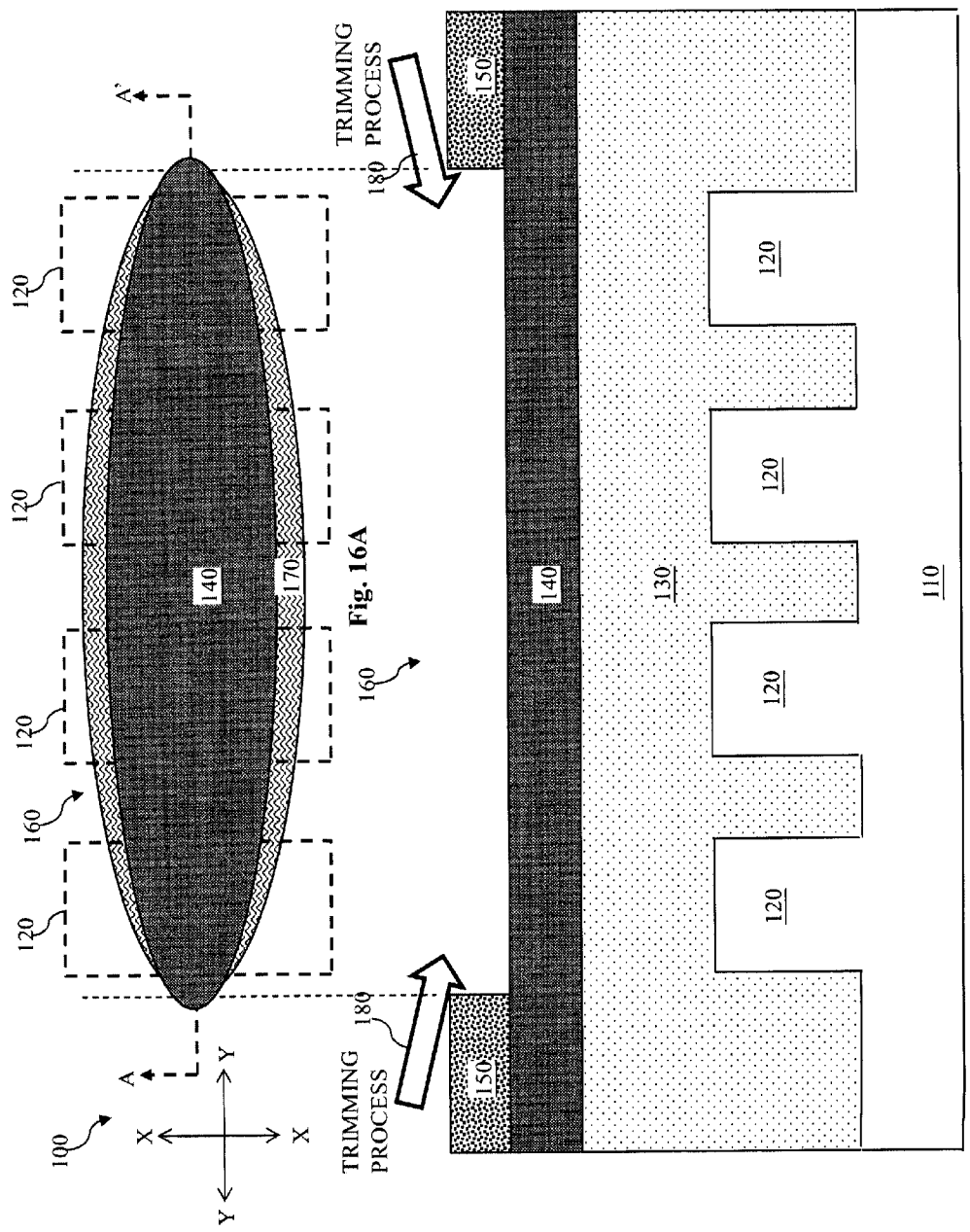

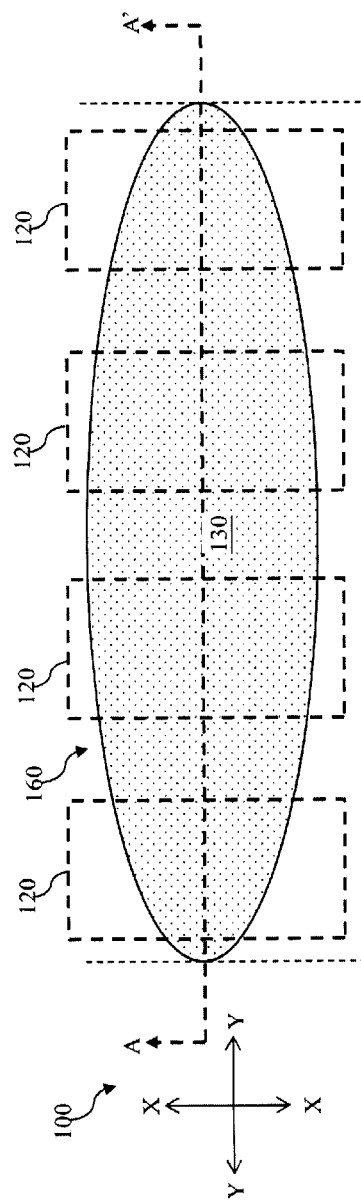
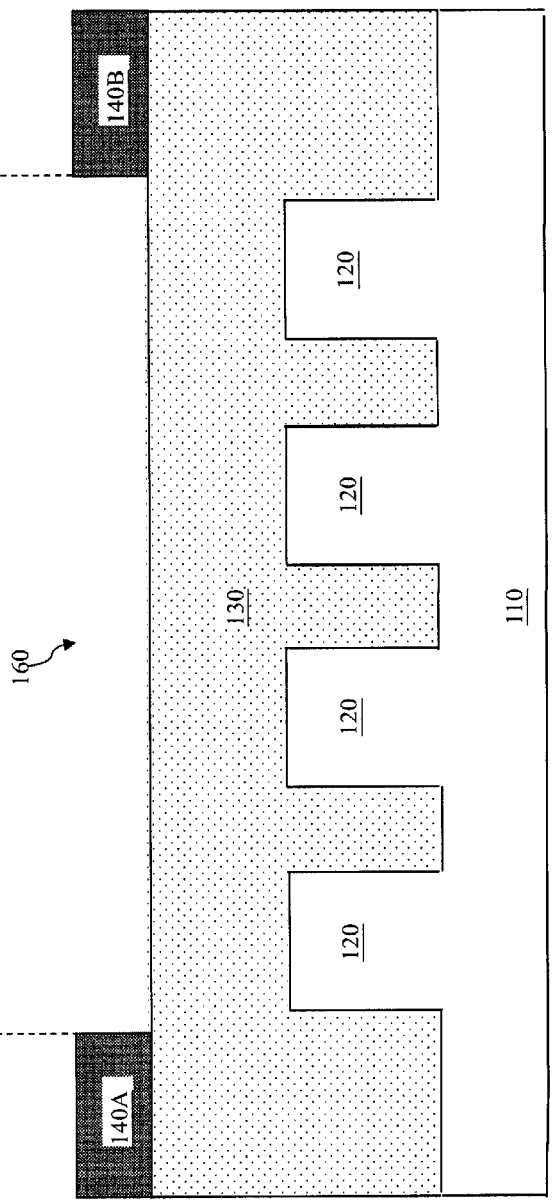

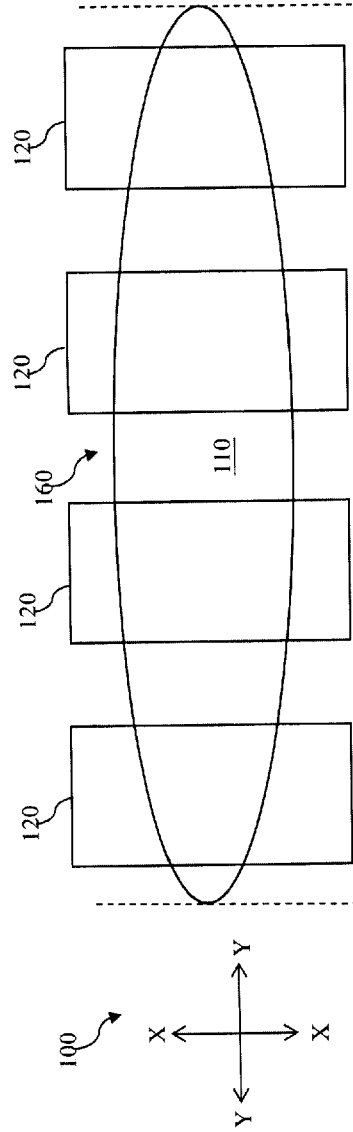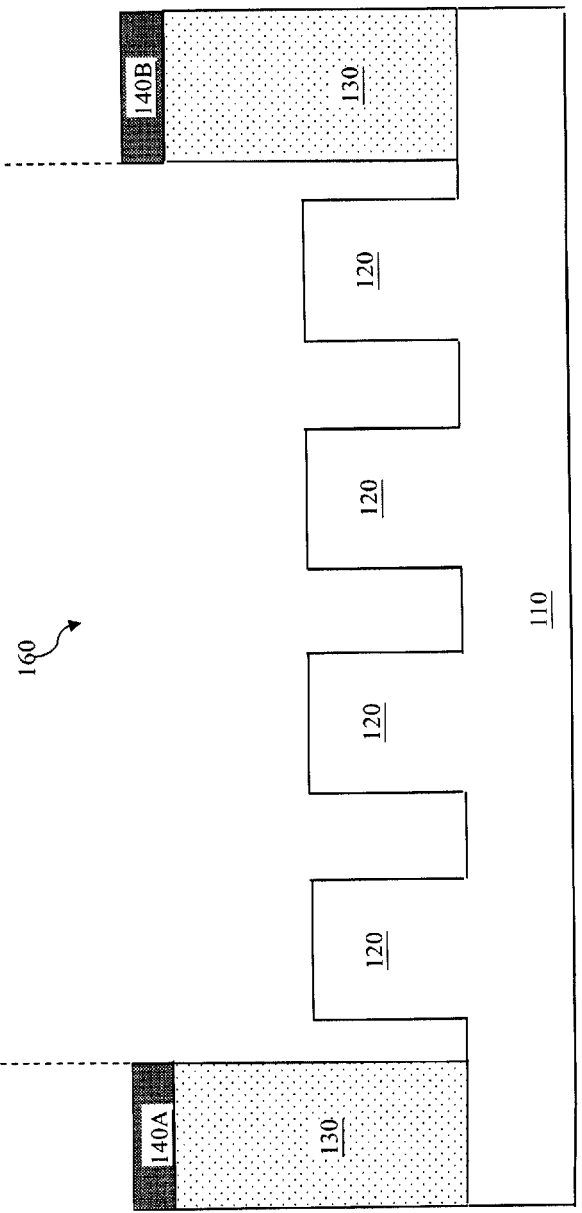

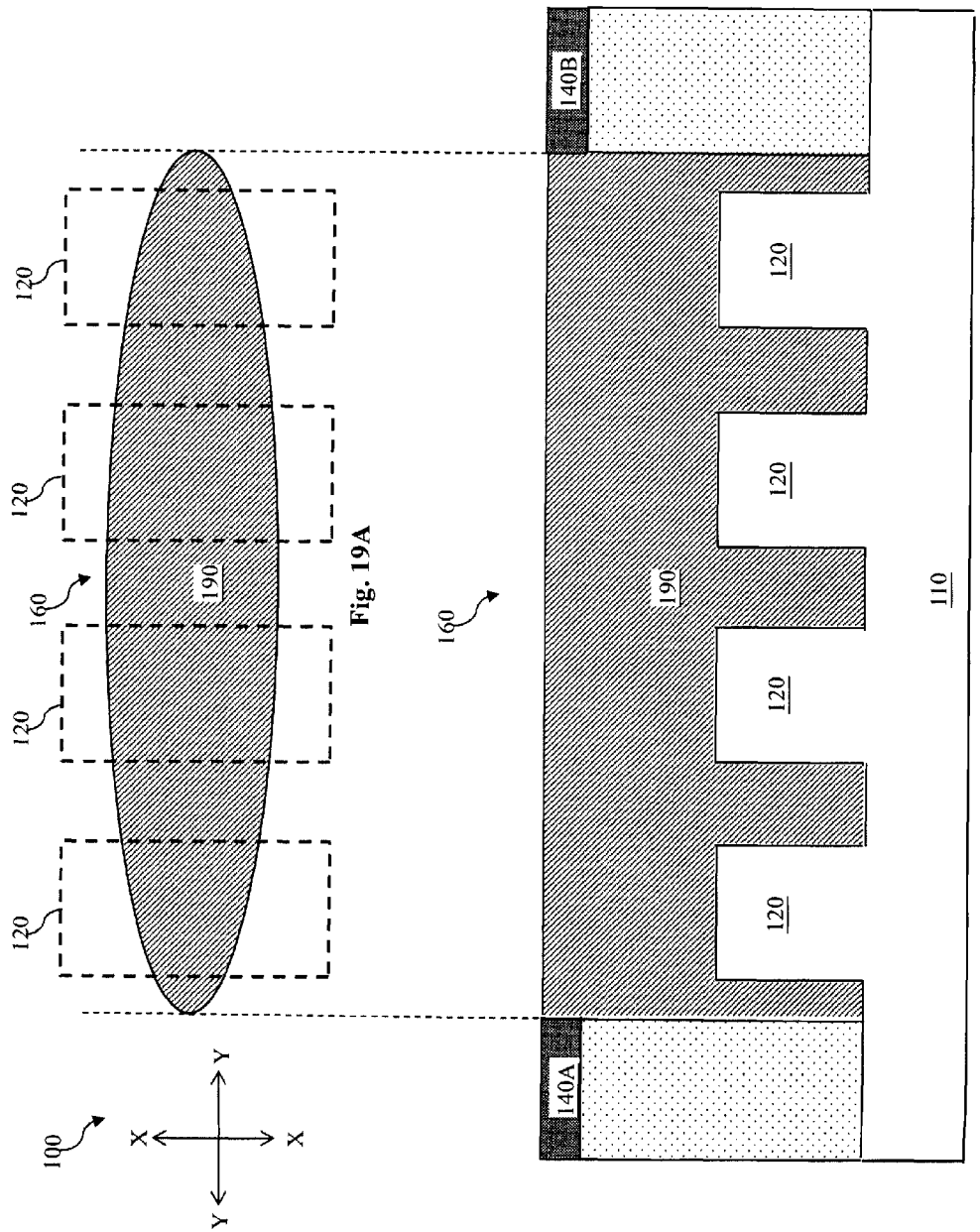

US 8,999,777 B2

METHOD OF CONDUCTING A DIRECTION-SPECIFIC TRIMMING PROCESS FOR CONTACT PATTERNING

BACKGROUND

The semiconductor integrated circuit (IC) industry has experienced rapid growth. Technological advances in IC materials and design have produced generations of ICs where each generation has smaller feature sizes and more complex circuits than those from the previous generation. These advances are made in pursuit of higher device density, higher performance, and lower costs. As this technological progression takes place, conventional lithography alone may not be able to satisfy the increasingly stringent demands of design rules. As a result, various patterning techniques have been developed to help push the limits of lithography. However, even these patterning techniques may not be able to sufficiently address the challenges brought by three-dimensional transistor devices, such as fin-like field effect transistor (FinFET) device. In that regard, a typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel, reduced short channel effect, and higher current flow. However, FinFET devices may also require stricter End to End (ETE) critical dimension (CD) control for contact landing. These requirements have not been sufficiently met by conventional lithography or the various patterning techniques that exist today.

Therefore, while existing methods of fabricating advanced semiconductor devices have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-19A are diagrammatic fragmentary top level views of a FinFET device at different stages fabrication in accordance with various embodiments of the present disclosure.

FIGS. 2B-19B are diagrammatic fragmentary cross-sectional side views of the FinFET device at different stages fabrication in accordance with various embodiments of the present disclosure.

DETAILED DESCRIPTION

Figure 1:
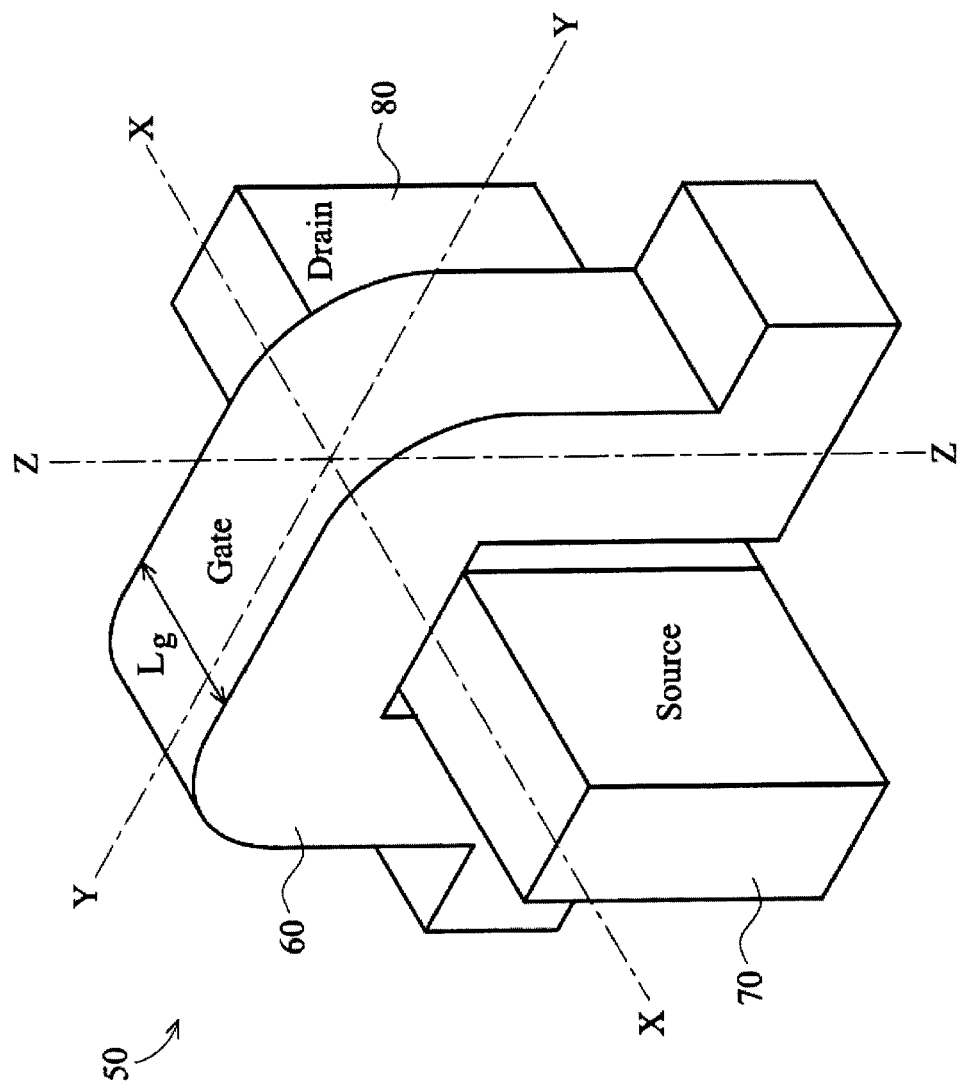
FIG. 1 is a perspective view of an example FinFET device.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

The use of FinFET devices has been gaining popularity in the semiconductor industry. Referring to FIG. 1, a perspective view of an example FinFET device 50 is illustrated. The FinFET device 50 is a non-planar multi-gate transistor that is built on a substrate. A thin silicon "fin-like" structure (referred to as fin) forms the body of the FinFET device 50. A gate 60 of the FinFET device 50 is wrapped around this fin. Lg denotes a length (or width, depending on the perspective) of the gate 60. A source 70 and a drain 80 of the FinFET device 50 are formed in extensions of the fin on opposite sides of the gate 60. The fin itself serves as a channel. The effective channel length of the FinFET device 50 is determined by the dimensions of the fin.

FinFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, the design rules for FinFET devices require strict End to End (ETE) critical dimension (CD) control for contact overlay landing. Traditional lithography methods may not be able to meet the design rules for FinFET devices. Therefore, the present disclosure proposes a novel method of contact patterning for FinFET devices.

FIGS. 2A-2B to FIGS. 7A-7B are simplified diagrammatic top views (or planar views) and fragmentary cross-sectional views of a semiconductor device 100 undergoing various stages of fabrication according to an embodiment of the present disclosure. FIGS. 2B-7B are cross-sectional views taken from point A to A' in the top views of FIGS. 2A-7A, respectively. It is also understood that the top views of FIGS. 2A-7A are views of an X-Y plane (also referred to as a horizontal plane) defined by an X-axis and a Y-axis consistent with those shown in FIG. 1. The various layers of the semiconductor device 100 are stacked along a Z-axis (also referred to as a vertical direction/axis) consistent with that shown in FIG. 1.

In the illustrated embodiment, the semiconductor device 100 is a FinFET device and may hereinafter be referred to as such. However, it is understood that the various concepts disclosed herein may apply to other types of semiconductor devices as well.

Referring now to FIG. 2A-2B, the FinFET device 100 includes a substrate 110. In various embodiments, the substrate 110 may include a semiconductor material such as silicon, or a group III-V compound (such as InGaAs, InAs, GaAs, InP, etc.), or Ge, or SiGe, or another suitable material. The substrate 110 includes a plurality of upwardly protruding fin structures 120. In one embodiment, the fin structures 120 are doped with an n-type material, for example arsenic (As) or phosphorous (P). In another embodiment, the fin structures 120 are doped with a p-type material, for example Boron (B). The fin structures 120 constitute the source/drain regions of the FinFET device 100.

A dielectric layer 130 is formed over the substrate 110, including over the fin structures 120. In some embodiments, the dielectric layer 130 contains silicon oxide. In other embodiments, the dielectric layer 130 contains silicon nitride, silicon oxynitride, or silicon carbide.

A layer 140 is formed over the dielectric layer 130. In the illustrated embodiment, the layer 140 contains a hard mask material, which may be a dielectric material that is different from the dielectric layer 130. In another embodiment, the layer 140 may be a tri-layer material and includes a bottom layer and a middle layer. The bottom layer may be an organic material, for example a spin-on carbon material. The middle layer may also be an organic material, for example a silicon-containing anti-reflective coating (ARC) material. In yet other embodiments, the layer 140 may contain a metal material such as Ti, Ta, TiN, TaN, Al, or W. In yet other embodiments, the layer 140 may contain a high-k material such as $HfO_2$, $ZrO_2$, $La_2O_3$, $AlO_3$, $TiO_2$, etc.

A patterned layer 150 is formed over the layer 140. In the illustrated embodiment, the patterned layer 150 contains a photoresist material. In other embodiments, the patterned layer 150 contains a dielectric material such as silicon oxide, silicon nitride, silicon carbide. In yet other embodiments, the patterned layer 150 contains a metal material such as Ti, Ta, TiN, TaN, Al, W, or Cu. In yet some other embodiments, the patterned layer 150 may contain a high-k material such as $HfO_2$, $ZrO_2$, $La_2O_3$, $AlO_3$, $TiO_2$, etc. It is understood that the material compositions of the layers 140 and 150 are different.

The patterned layer 150 has been patterned by a suitable lithography process to include an opening 160. In the illustrated embodiment, the opening 160 may have an approximately elliptical profile (as shown in the top view of FIG. 2A). In other words, from the top view of FIG. 2A, the exposed portions of the layer 140 have an approximately elliptical shape. It is also understood that the fin structures 120 may not be directly visible in the top view of FIG. 2A at this stage of fabrication, and therefore the fin structures 120 are illustrated with broken lines in FIG. 2A.

Referring now to FIGS. 3A-3B, the layer 140 is patterned in an etching process. The layer 150 serves as an etching mask. As a result, a portion of the layer 140 is removed, leaving remaining portions 140A and 140B (shown in FIG. 3B). It is understood that the remaining portions 140A-140B are actually connected (as shown in the top view of FIG. 3A), but they are shown as two separate pieces in the cross-sectional view of FIG. 4B. Thus, the opening 160 is effectively extended into the layer 140. Thereafter, the layer 150 is removed.

Referring now to FIGS. 4A-4B, a material 170 is deposited into the opening 160 to reduce the dimensions of the opening 160. The material 170 may be any suitable material, for example a polymer material in some embodiments.

Referring now to FIGS. 5A-5B, the material 170 is etched back to form spacers 170A-170B. Again, the spacers 170A-170B are actually connected (as shown in the top view of FIG. 5A), but they are shown as two separate pieces in the cross-sectional view of FIG. 5B. The spacers 170A-170B have tapered edges or profiles in the cross-sectional view. The spacers 170A-170B effectively reducing the size of the opening 160. As illustrated in the top view of FIG. 5A, the opening 160 is reduced in size in both the X-direction and the Y-direction. This is done so that smaller device dimensions may be achieved.

As is shown clearly in FIG. 5A, the reduced opening 160 does not cover some of the fin structures 120 (the outer ones). In other words, if the opening 160 is extended vertically downwards into the dielectric layer 130 to expose the fin structures 120 underneath, only some, but not all, of the fin structures 120 would be exposed. As a result, when a contact deposition process is performed later to fill such opening, not all of the fin structures 120 would make electrical connections with the contact. To address this issue, the present disclosure involves performing a direction-specific trimming process to enlarge the opening 160 in one specific direction, as discussed below.

Referring now to FIGS. 6A-6B, a trimming process 180 is performed on the spacers 170A-170B and the layer 140. In some embodiments, the trimming process 180 is conducted with a neutral ion beam physical etcher with a specific tilt angle. For example, ion beams (e.g., Ar) may be configured to bombard the spacer 170A and the portion 140A of the layer 140 from the right side. The ion beams will then bombard the spacer 170B and the portion 140B of the layer 140 from the left side. The sequence as to which side is bombarded first is not important and may be changed. In some embodiments, the wafer chuck holding the wafer on which the FinFET device 100 may be tilted to achieve a specific tilt angle requirement. In other embodiments, the tool emitting the ion beams may be tilted with respect to the wafer to achieve the specific tilt angle requirement.

The tilt angle of the ion beams may be configured to approach 180 degrees, or in other words, almost level or parallel with a surface of the layer 140. Thus, in contrast to conventional plasma treatment processes where ion beams bombard a semiconductor device vertically (from a perpendicular direction), or with a small tilt angle, the present disclosure involves performing the ion bombardment in a substantially sideways manner. As a result, the opening 160 is enlarged in the Y-direction, but the size of the opening in the X-direction remains relatively unchanged (or at least not changed as much as in the Y-direction). Stated differently, the ion beams bombard the layer 140 in the Y-direction but not in the X-direction. As such, the layer 140 is "trimmed" in the Y-direction but not in the X-direction. Therefore, the trimming process 180 discussed above may be referred to as a direction-specific trimming process. In some embodiments, the process 180 may also be referred to as a direction-specific trimming process.

It is understood that the trimming process may be performed in more than one stage or step. For example, in a first stage, the ion beams may be configured to bombard the portion 140A in a sideways manner. When this is finished, the FinFET device 100 may be rotated 180 degrees, and the ion beams may now be configured to bombard the portion 140B in a sideways manner. In other embodiments, the FinFET device 100 itself may remain stationary, but the tool used to emit the ion beams may be moved to the other side (180 degrees) to complete the trimming of both the portions 140A and 140B (and the spacers 170A-170B).

As is shown in FIG. 6B, the trimming process 180 may also end up removing a portion of the dielectric layer 130 in addition to the layer 140. This is not a problem, since portions of the dielectric layer 130 below the opening 160 will be removed in a subsequent process anyway.

It is also understood that the trimming process 180 need not necessarily be limited to just the X direction or the Y direction. For example, in situations where appropriate, the ion beams may be configured to bombard the layer 140 in a direction that has both an X-axis component and a Y-axis component. The larger the X-axis component, the more the opening 160 will be enlarged in the X-direction. Similarly, the larger the Y-axis component, the more the opening 160 will be enlarged in the Y-direction. By configuring the specific directions of the trimming process 180, the opening 160 may be shaped into any desirable profile. For example, the opening 160 may initially have an approximately elliptical top view profile, but the trimming process 180 may be performed in a manner so that the opening 160 is shaped into having a more rectangular top view profile. In addition to the direction of the ion beams, the trimming process 180 may also be tuned by adjusting process parameters such as the tilt angle of the ion beams, the etching duration, the plasma energy, etc. In some embodiments, the trimming process 180 is tuned to have a trim rate of about 1 to 2 angstroms per second in a given direction.

Regardless of the specific details of the trimming process 180, it can be seen in FIG. 6A that the trimming process 180 allows the opening 160 to be enlarged in the Y-direction but not in the X-direction. The enlarged opening 160 ensures that all the fin structures 120 therebelow can make electrical connections with a conductive contact (to be formed later). Meanwhile, since the opening 160 is not necessarily enlarged in the X-direction, it helps to maintain small critical dimensions or feature sizes. The fact that the opening 160 can be enlarged in a specific direction by the trimming process 180 can also be used to improve contact overlay control.

It is understood that in some embodiments, a trimming direction and a trimming amount of the trimming process 180 can be adjusted by Advanced Process Control (APC). For example, APC techniques may include using models and feedback systems to help process variations encountered during semiconductor fabrication. APC techniques may be utilized to establish models to predict process performance. In the present case, APC techniques may be used to measure overlay variations (for example the overlay between the fin structures 120 and the initial opening 160), and such overlay variations can be fed forward to the trimming process 180 to account for these overlay variations. As an example, if the initial opening 160 is formed too much to one direction (left or right) of the fin structures 120, that overlay variation can be taken into account by APC and fed to the trimming process 180. The trimming process 1800 can be performed to extend the opening more in the other direction, so as to account for the undesired overlay variation.

Referring now to FIGS. 7A-7B, an etching process is performed to extend the opening 160 vertically downwards by removing portions of the dielectric layer 130 below the (now enlarged in the Y-direction) opening 160. The layer 140 serves as an etching mask during the etching process. As a result of the etching process, the fin structures 120 are exposed by the opening 160. Again, if the trimming process 180 in FIG. 6 had not been performed, it is likely that not all of the fin structures 120 would have been exposed, since the smaller opening 160 shown in FIGS. 5A-5B would have only been able to expose some of the fin structures 120 (i.e., the fin structures 120 disposed in the middle).

Referring now to FIGS. 8A-8B, a deposition process is performed to fill the opening 160 with a conductive element 190. In some embodiments, the conductive element 190 includes a metal material, for example Tungsten, Copper, Aluminum, Gold, or a suitable alloy thereof. The conductive element 190 serves as the electrical contact (and may hereinafter be referred to as such) for the fin structures 120, which are the source/drain regions for the FinFET device 100. Since the opening 160 is enlarged in the Y-direction, all of the fin structures now make good electrical connections with the contact 190, which may not have been possible under conventional FinFET fabrication schemes.

FIGS. 2-8 discussed above illustrate one embodiment of a "hardmask trimming" approach of performing the direction-specific trimming process. FIGS. 9-13 illustrate another embodiment of a "hardmask trimming" approach of performing the direction-specific trimming process. For reasons of clarity and consistency, similar components appearing in FIGS. 2-8 are labeled the same in FIGS. 9-13.

Again, FIGS. 9B-13B are cross-sectional views taken from point A to A' in the top views of FIGS. 9A-13A, respectively. It is also understood that the top views of FIGS. 9A-13A are views of an X-Y plane (also referred to as a horizontal plane) defined by an X-axis and a Y-axis consistent with those shown in FIG. 1. The various layers of the semiconductor device 100 are stacked along a Z-axis (also referred to as a vertical direction/axis) consistent with that shown in FIG. 1.

In the illustrated embodiment, the semiconductor device 100 is a FinFET device and may hereinafter be referred to as such. However, it is understood that the various concepts disclosed herein may apply to other types of semiconductor devices as well.

Figures 9A, 9B:
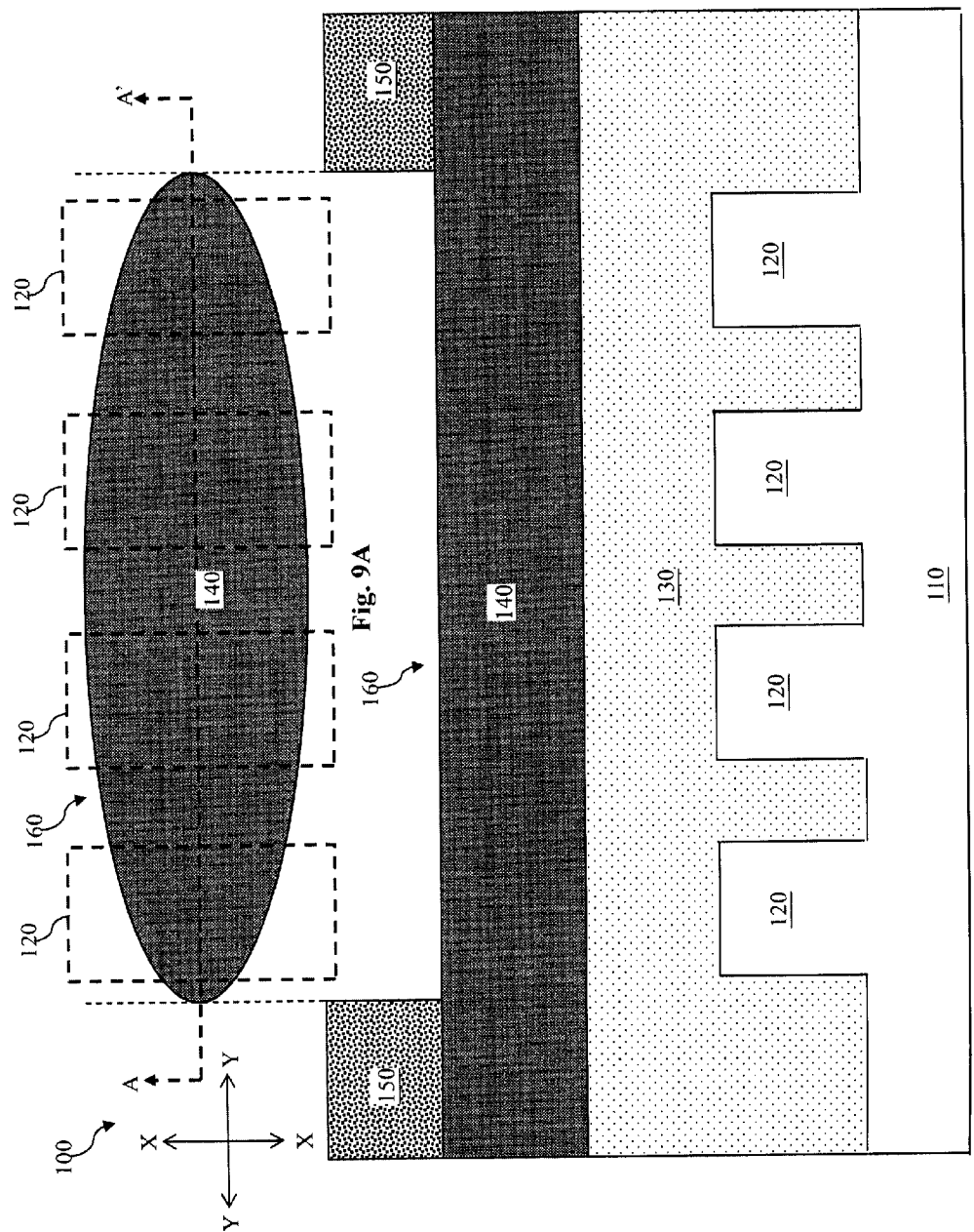

Referring now to FIG. 9A-9B, the FinFET device 100 includes a substrate 110. In various embodiments, the substrate 110 may include a semiconductor material such as silicon, or a group III-V compound (such as InGaAs, InAs, GaAs, InP, etc.), or Ge, or SiGe, or another suitable material. The substrate 110 includes a plurality of upwardly protruding fin structures 120. In one embodiment, the fin structures 120 are doped with an n-type material, for example arsenic (As) or phosphorous (P). In another embodiment, the fin structures 120 are doped with a p-type material, for example Boron (B). The fin structures 120 constitute the source/drain regions of the FinFET device 100.

A dielectric layer 130 is formed over the substrate 110, including over the fin structures 120. In some embodiments, the dielectric layer 130 contains silicon oxide. In other embodiments, the dielectric layer 130 contains silicon nitride, silicon oxynitride, or silicon carbide.

A layer 140 is formed over the dielectric layer 130. In the illustrated embodiment, the layer 140 contains a hard mask material, which may be a dielectric material that is different from the dielectric layer 130. In another embodiment, the layer 140 may be a tri-layer material and includes a bottom layer and a middle layer. The bottom layer may be an organic material, for example a spin-on carbon material. The middle layer may also be an organic material, for example a silicon-containing anti-reflective coating (ARC) material. In yet other embodiments, the layer 140 may contain a metal material such as Ti, Ta, TiN, TaN, Al, or W. In yet other embodiments, the layer 140 may contain a high-k material such as $HfO_2$, $ZrO_2$, $La_2O_3$, $AlO_3$, $TiO_2$, etc.

A patterned layer 150 is formed over the layer 140. In the illustrated embodiment, the patterned layer 150 contains a photoresist material. In other embodiments, the patterned layer 150 contains a dielectric material such as silicon oxide, silicon nitride, silicon carbide. In yet other embodiments, the patterned layer 150 contains a metal material such as Ti, Ta, TiN, TaN, Al, W, or Cu. In yet some other embodiments, the patterned layer 150 may contain a high-k material such as $HfO_2$, $ZrO_2$, $La_2O_3$, $AlO_3$, $TiO_2$, etc. It is understood that the material compositions of the layers 140 and 150 are different.

The patterned layer 150 has been patterned by a suitable lithography process to include an opening 160. In the illustrated embodiment, the opening 160 may have an approximately elliptical profile (as shown in the top view of FIG. 9A). In other words, from the top view of FIG. 9A, the exposed portions of the layer 140 have an approximately elliptical shape. It is also understood that the fin structures 120 may not be directly visible in the top view of FIG. 9A at this stage of fabrication, and therefore the fin structures 120 are illustrated with broken lines in FIG. 9A.

Referring now to FIGS. 10A-10B, the layer 140 is patterned in an etching process. The layer 150 serves as an etching mask. As a result, a portion of the layer 140 is removed, leaving remaining portions 140A and 140B (shown in FIG. 10B). Thereafter, the layer 150 is removed. It is understood that the remaining portions 140A-140B are actually connected (as shown in the top view of FIG. 10A), but they are shown as two separate pieces in the cross-sectional view of FIG. 10B. Thus, the opening 160 is effectively extended into the layer 140.

In the illustrated embodiment, the portions 140A and 140B have tapered edges or a tapered profile, as is shown in the cross-sectional view in FIG. 10B. This tapered profile can be achieved by tuning the etching process. Thus, unlike the embodiment discussed above with reference to FIGS. 2-9, where the material 170 is deposited into the opening 160 to reduce the dimensions of the opening 160, the embodiment shown in FIGS. 10A-10B uses etching to shape the profile of the layer 140, thereby reducing the dimensions of the opening 160. Again, as illustrated in the top view of FIG. 10A, the opening 160 is reduced in size in both the X-direction and the Y-direction. This is done so that smaller device dimensions may be achieved.

As is shown clearly in FIG. 10A, the reduced opening 160 does not cover some of the fin structures 120 (the outer ones). In other words, if the opening 160 is extended vertically downwards into the dielectric layer 130 to expose the fin structures 120 underneath, only some, but not all, of the fin structures 120 would be exposed. As a result, when a contact deposition process is performed later to fill such opening, not all of the fin structures 120 would make electrical connections with the contact. To address this issue, the present disclosure involves performing a direction-specific trimming process to enlarge the opening 160 in one specific direction, as discussed below.

Figures 11A, 11B:
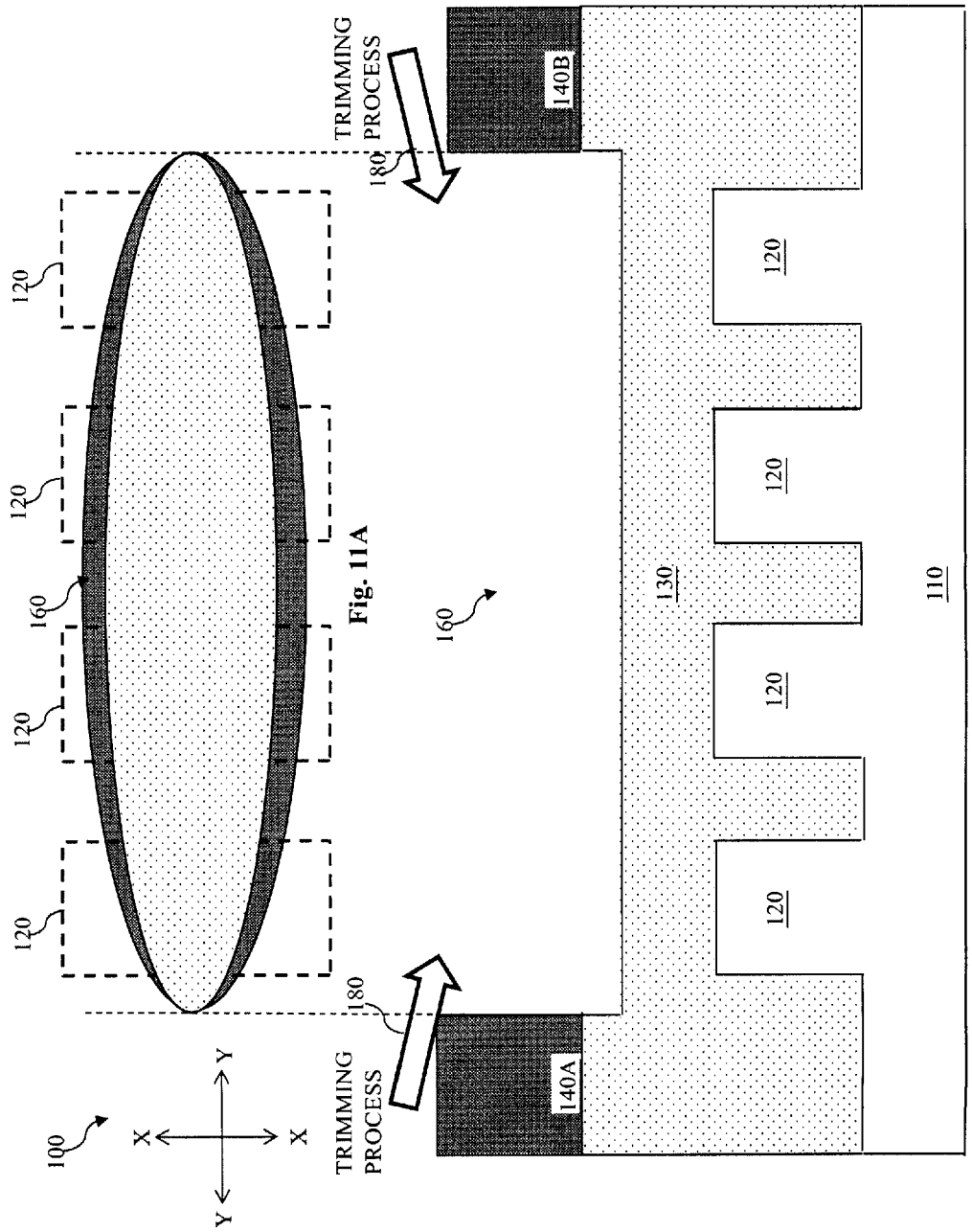

Referring now to FIGS. 11A-11B, a trimming process 180 is performed on the layer 140. In some embodiments, the trimming process 180 is conducted with a neutral ion beam physical etcher with a specific tilt angle. For example, ion beams (e.g., Ar) may be configured to bombard the portion 140A of the layer 140 from the right side. The ion beams will then bombard the portion 140B of the layer 140 from the left side. The sequence as to which side is bombarded first is not important and may be changed. In some embodiments, the wafer chuck holding the wafer on which the FinFET device 100 may be tilted to achieve a specific tilt angle requirement. In other embodiments, the tool emitting the ion beams may be tilted with respect to the wafer to achieve the specific tilt angle requirement.

The tilt angle of the ion beams may be configured to approach 180 degrees, or in other words, almost level or parallel with a surface of the layer 140. Thus, in contrast to conventional plasma treatment processes where ion beams bombard a semiconductor device vertically (from a perpendicular direction), or with a small tilt angle, the present disclosure involves performing the ion bombardment in a substantially sideways manner. As a result, the opening 160 is enlarged in the Y-direction, but the size of the opening in the X-direction remains relatively unchanged (or at least not changed as much as in the Y-direction). Stated differently, the ion beams bombard the layer 140 in the Y-direction but not in the X-direction. As such, the layer 140 is "trimmed" in the Y-direction but not in the X-direction. Therefore, the trimming process 180 discussed above may be referred to as a direction-specific trimming process. In some embodiments, the process 180 may also be referred to as a direction-specific trimming process.

It is understood that the trimming process may be performed in more than one stage or step. For example, in a first stage, the ion beams may be configured to bombard the portion 140A in a sideways manner. When this is finished, the FinFET device 100 may be rotated 180 degrees, and the ion beams may now be configured to bombard the portion 140B in a sideways manner. In other embodiments, the FinFET device 100 itself may remain stationary, but the tool used to emit the ion beams may be moved to the other side (180 degrees) to complete the trimming of both the portions 140A and 140B.

As is shown in FIG. 11B, the trimming process 180 may also end up removing a portion of the dielectric layer 130 in addition to the layer 140. This is not a problem, since portions of the dielectric layer 130 below the opening 160 will be removed in a subsequent process anyway.

It is also understood that the trimming process 180 need not necessarily be limited to just the X direction or the Y direction. For example, in situations where appropriate, the ion beams may be configured to bombard the layer 140 in a direction that has both an X-axis component and a Y-axis component. The larger the X-axis component, the more the opening 160 will be enlarged in the X-direction. Similarly, the larger the Y-axis component, the more the opening 160 will be enlarged in the Y-direction. By configuring the specific directions of the trimming process 180, the opening 160 may be shaped into any desirable profile. For example, the opening 160 may initially have an approximately elliptical top view profile, but the trimming process 180 may be performed in a manner so that the opening 160 is shaped into having a more rectangular top view profile. In addition to the direction of the ion beams, the trimming process 180 may also be tuned by adjusting process parameters such as the tilt angle of the ion beams, the etching duration, the plasma energy, etc. In some embodiments, the trimming process 180 is tuned to have a trim rate of about 1 to 2 angstroms per second in a given direction.

Regardless of the specific details of the trimming process 180, it can be seen in FIG. 11A that the trimming process 180 allows the opening 160 to be enlarged in the Y-direction but not in the X-direction. The enlarged opening 160 ensures that all the fin structures 120 therebelow can make electrical connections with a conductive contact (to be formed later). Meanwhile, since the opening 160 is not necessarily enlarged in the X-direction, it helps to maintain small critical dimensions or feature sizes. The fact that the opening 160 can be enlarged in a specific direction by the trimming process 180 can also be used to improve contact overlay control.

It is understood that in some embodiments, a trimming direction and a trimming amount of the trimming process 180 can be adjusted by Advanced Process Control (APC). For example, APC techniques may include using models and feedback systems to help process variations encountered during semiconductor fabrication. APC techniques may be utilized to establish models to predict process performance. In the present case, APC techniques may be used to measure overlay variations (for example the overlay between the fin structures 120 and the initial opening 160), and such overlay variations can be fed forward to the trimming process 180 to account for these overlay variations. As an example, if the initial opening 160 is formed too much to one direction (left or right) of the fin structures 120, that overlay variation can be taken into account by APC and fed to the trimming process 180. The trimming process 1800 can be performed to extend the opening more in the other direction, so as to account for the undesired overlay variation.

Referring now to FIGS. 12A-12B, an etching process is performed to extend the opening 160 vertically downwards by removing portions of the dielectric layer 130 below the (now enlarged in the Y-direction) opening 160. The layer 140 serves as an etching mask during the etching process. As a result of the etching process, the fin structures 120 are exposed by the opening 160. Again, if the trimming process 180 in FIG. 11 had not been performed, it is likely that not all of the fin structures 120 would have been exposed, since the smaller opening 160 shown in FIGS. 10A-10B would have only been able to expose some of the fin structures 120 (i.e., the fin structures 120 disposed in the middle).

Referring now to FIGS. 13A-13B, a deposition process is performed to fill the opening 160 with a conductive element 190. In some embodiments, the conductive element 190 includes a metal material, for example Tungsten, Copper, Aluminum, Gold, or a suitable alloy thereof. The conductive element 190 serves as the electrical contact (and may hereinafter be referred to as such) for the fin structures 120, which are the source/drain regions for the FinFET device 100. Since the opening 160 is enlarged in the Y-direction, all of the fin structures now make good electrical connections with the contact 190, which may not have been possible under conventional FinFET fabrication schemes.

FIGS. 2A-2B to 13A-13B illustrate two embodiments of the "Hardmask trimming" approach of performing the direction-specific trimming process. FIGS. 14A-14B to 19A-19B illustrate an alternative "photoresist trimming" approach of performing the direction-specific trimming process. For reasons of clarity and consistency, similar components appearing in FIGS. 2-13 are labeled the same in FIGS. 14-19.

Figure 14A:
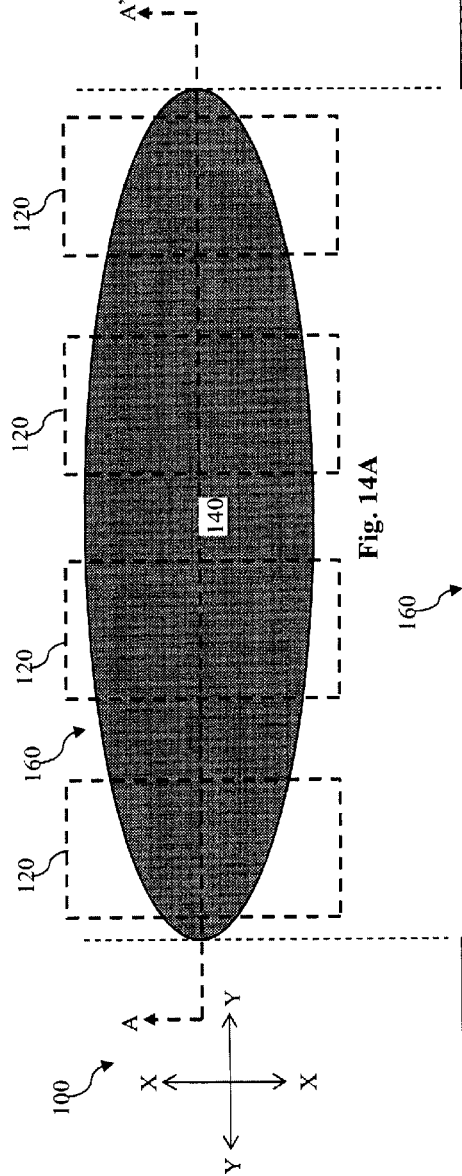
Figure 14B:
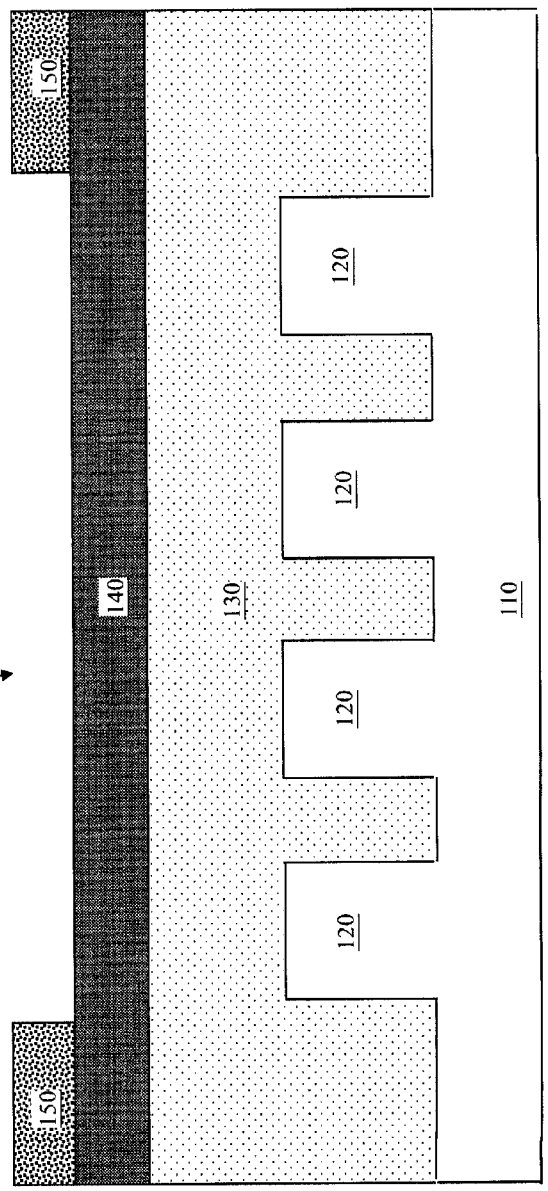

Referring now to FIG. 14A-14B, the FinFET device 100 includes a substrate 110. In various embodiments, the substrate 110 may include a semiconductor material such as silicon, or a group III-V compound (such as InGaAs, InAs, GaAs, InP, etc.), or Ge, or SiGe, or another suitable material. The substrate 110 includes a plurality of upwardly protruding fin structures 120. In one embodiment, the fin structures 120 are doped with an n-type material, for example arsenic (As) or phosphorous (P). In another embodiment, the fin structures 120 are doped with a p-type material, for example Boron (B). The fin structures 120 constitute the source/drain regions of the FinFET device 100. The conductive channel of the FinFET device is also included in the fin structures 120.

A dielectric layer 130 is formed over the substrate 110, including over the fin structures 120. In some embodiments, the dielectric layer 130 contains silicon oxide. In other embodiments, the dielectric layer 130 contains silicon nitride, silicon oxynitride, or a low-k material.

A layer 140 is formed over the dielectric layer 130. In the illustrated embodiment, the layer 140 contains a hard mask material, which may be a dielectric material that is different from the dielectric layer 130. In another embodiment, the layer 140 may be a tri-layer material and includes a bottom layer and a middle layer. The bottom layer may be an organic material, for example a spin-on carbon material. The middle layer may also be an organic material, for example a silicon-containing anti-reflective coating (ARC) material. In yet other embodiments, the layer 140 may contain a metal material such as Ti, Ta, TiN, TaN, Al, or W. In yet other embodiments, the layer 140 may contain a high-k material such as HfO2, ZrO2, La2O3, AlO3, TiO2, etc.

A patterned layer 150 is formed over the layer 140. In the illustrated embodiment, the patterned layer 150 contains a photoresist material. In other embodiments, the patterned layer 150 contains a dielectric material such as silicon oxide, silicon nitride, silicon carbide. In yet other embodiments, the patterned layer 150 contains a metal material such as Ti, Ta, TiN, TaN, Al, W, or Cu. In yet some other embodiments, the patterned layer 150 may contain a high-k material such as $HfO_2$, $ZrO_2$, $La_2O_3$, $AlO_3$, $TiO_2$, etc. It is understood that the material compositions of the layers 140 and 150 are different.

The patterned layer 150 has been patterned by a suitable lithography process to include an opening 160. In the illustrated embodiment, the opening 160 may have an approximately elliptical profile (as shown in the top view of FIG. 14A). In other words, from the top view of FIG. 14A, the exposed portions of the layer 140 have an approximately elliptical shape. It is also understood that the fin structures 120 may not be directly visible in the top view of FIG. 14A at this stage of fabrication, and therefore the fin structures 120 are illustrated with broken lines in FIG. 14A.

Referring now to FIGS. 15A-15B, a material 170 is deposited in the opening 160, thereby effectively reducing the size of the opening 160. As illustrated in the top view of FIG. 3A, the opening 160 is reduced in size in both the X-direction and the Y-direction. This is done so that smaller device dimensions may be achieved. In some embodiments, the material 170 contains polymer.

As is shown clearly in FIG. 15A, the opening 160 does not cover some of the fin structures 120 (the outer ones). In other words, if the opening is extended vertically downwards into the dielectric layer 130 to expose the fin structures 120 underneath, only some, but not all, of the fin structures would be exposed. As a result, when a contact deposition process is performed later to fill such opening, not all of the fin structures would make electrical connections with the contact. To address this issue, the present disclosure involves performing a trimming process to enlarge the opening 160 in one specific direction, as discussed below.

Referring now to FIGS. 16A-16B, a trimming process 180 is performed on the layer 150 and the material 170. In some embodiments, the trimming process 180 is conducted with a neutral ion beam physical etcher with a specific tilt angle. For example, ion beams (e.g., Ar) may be configured to bombard the left portion of the material 170 from its right side, and bombard the right portion of the material 170 from its left side. In some embodiments, the wafer chuck holding the wafer on which the FinFET device 100 may be tilted to achieve a specific tilt angle requirement. In other embodiments, the tool emitting the ion beams may be tilted with respect to the wafer to achieve the specific tilt angle requirement.

The tilt angle of the ion beams may be configured to approach 180 degrees, or in other words, almost level or parallel with a surface of the layer 150 or 140. Thus, in contrast to conventional plasma treatment processes where ion beams bombard a semiconductor device vertically (from a perpendicular direction), or with a small tilt angle, the present disclosure involves performing the ion bombardment in a substantially sideways manner. As a result, the opening 160 is enlarged in the Y-direction, but the size of the opening in the X-direction remains relatively unchanged. Stated differently, the ion beams bombard the layer 140 in the Y-direction but not in the X-direction. As such, the material 170 is trimmed away in the Y-direction, and the layer 150 may or may not be "trimmed" in the Y-direction. The material 170 and the layer 150 are not trimmed in the X-direction, however. Therefore, the ion bombardment process discussed above may be referred to as a direction-specific trimming process.

It is understood that the trimming process may be performed in more than one stage or step. For example, in a first stage, the ion beams may be configured to bombard one side of the material 170 in a sideways manner. When this is finished, the FinFET device 100 may be rotated 180 degrees, and the ion beams may now be configured to bombard the other side of the material 170 in a sideways manner. In other embodiments, the FinFET device 100 itself may remain stationary, but the tool used to emit the ion beams may be moved to the other side (180 degrees) to complete the trimming of the material 170.

It is also understood that the trimming process 180 need not necessarily be one-dimensional. For example, in situations where appropriate, the ion beams may be configured to bombard the material 170 in a direction that has both an X-axis component and a Y-axis component. The larger the X-axis component, the more the opening 160 will be enlarged in the X-direction. Similarly, the larger the Y-axis component, the more the opening 160 will be enlarged in the Y-direction. By configuring the specific directions of the trimming process 180, the opening 160 may be shaped into any desirable profile. For example, the opening 160 may initially have an approximately elliptical top view profile, but the trimming process 180 may be performed in a manner so that the opening 160 is shaped into having a more rectangular top view profile. In addition to the direction of the ion beams, the trimming process 180 may also be tuned by adjusting process parameters such as the tilt angle of the ion beams, the etching duration, the plasma energy, etc. In some embodiments, the trimming process 180 is tuned to have a trim rate of about 1 to 2 angstroms per second in a given direction.

Regardless of the specific details of the trimming process 180, it can be seen in FIG. 16A that the trimming process 180 allows the opening 160 to be enlarged in the Y-direction but not in the X-direction. The enlarged opening 160 ensures that all the fin structures 120 therebelow can make electrical connections with a conductive contact (to be formed later). Meanwhile, since the opening 160 is not necessarily enlarged in the X-direction, it helps to maintain small critical dimensions or feature sizes. The fact that the opening 160 can be enlarged in a specific direction by the trimming process 180 can also be used to improve contact overlay control.

It is understood that in some embodiments, a trimming direction and a trimming amount of the trimming process 180 can be adjusted by Advanced Process Control (APC). For example, APC techniques may include using models and feedback systems to help process variations encountered during semiconductor fabrication. APC techniques may be utilized to establish models to predict process performance. In the present case, APC techniques may be used to measure overlay variations (for example the overlay between the fin structures 120 and the initial opening 160), and such overlay variations can be fed forward to the trimming process 180 to account for these overlay variations. As an example, if the initial opening 160 is formed too much to one direction (left or right) of the fin structures 120, that overlay variation can be taken into account by APC and fed to the trimming process 180. The trimming process 1800 can be performed to extend the opening more in the other direction, so as to account for the undesired overlay variation.

Referring now to FIGS. 17A-17B, an etching process is performed to extend the opening 160 vertically downwards by removing portions of the layer 140 (now enlarged in the Y-direction). In some embodiments, the layer 150 serves as an etching mask during the etching process. The layer 150 is then removed afterwards.

Referring now to FIGS. 18A-18B, an etching process is performed to remove portions of the dielectric layer 130 below the opening 160. In other words, the opening 160 is extended vertically downwards into the dielectric layer 130. As a result of the etching process, the fin structures 120 are exposed by the opening 160. Again, if the trimming process 180 in FIG. 16B had not been performed, it is likely that not all of the fin structures 120 would have been exposed, since the smaller opening 160 shown in FIGS. 15A-15B would have only been able to expose some of the fin structures 120 (i.e., the fin structures 120 disposed in the middle).

Referring now to FIGS. 19A-19B, a deposition process is performed to fill the opening 160 with a conductive element 190. In some embodiments, the conductive element 190 includes a metal material, for example Tungsten, Copper, Aluminum, Gold, or a suitable alloy thereof. The conductive element 190 serves as the electrical contact (and may hereinafter be referred to as such) for the fin structures 120, which are the source/drain regions for the FinFET device 100. Since the opening 160 is enlarged in the Y-direction, all of the fin structures now make good electrical connections with the contact 190, which may not have been possible under conventional FinFET fabrication schemes.

Figure 20:
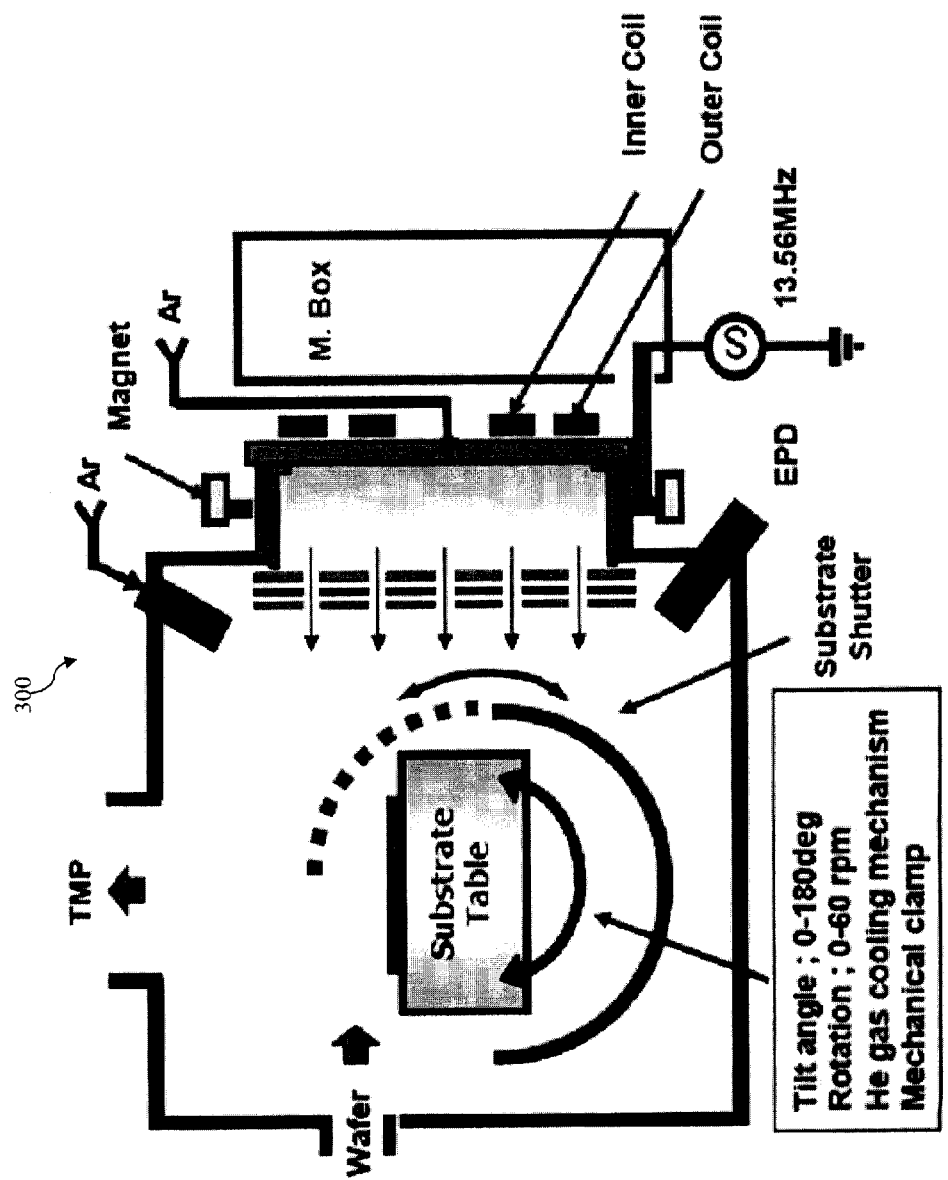
FIG. 20 is a simplified block diagram of a system for performing a trimming process according to various aspects of the present disclosure.

FIG. 20 illustrates a system 300 that may be used to perform the trimming process 180 discussed above. In the illustrated embodiment, the system 300 includes an ion beam etch (IBE) chamber. The system 300 may use a neutral etch gas, such as an Argon gas, which is plasma-damage-free. The system 300 may be configured to provide anisotropic trim/etching. In certain embodiments, the ion beam power is tuned to be in a range from about 2 kilo-watts (KW) to about 4 KW, and with a frequency range of about 13 mega-hertz (MHz) to about 14 MHz. The system 300 includes a wafer chuck that is rotatable and tiltable. The tilt angle of the wafer chuck may be in a range from about 0 degrees to about 180 degrees, and the rotation speed of the wafer chuck may be in a range from about 0 to 60 revolutions-per-minute (rpm).

Figure 21:
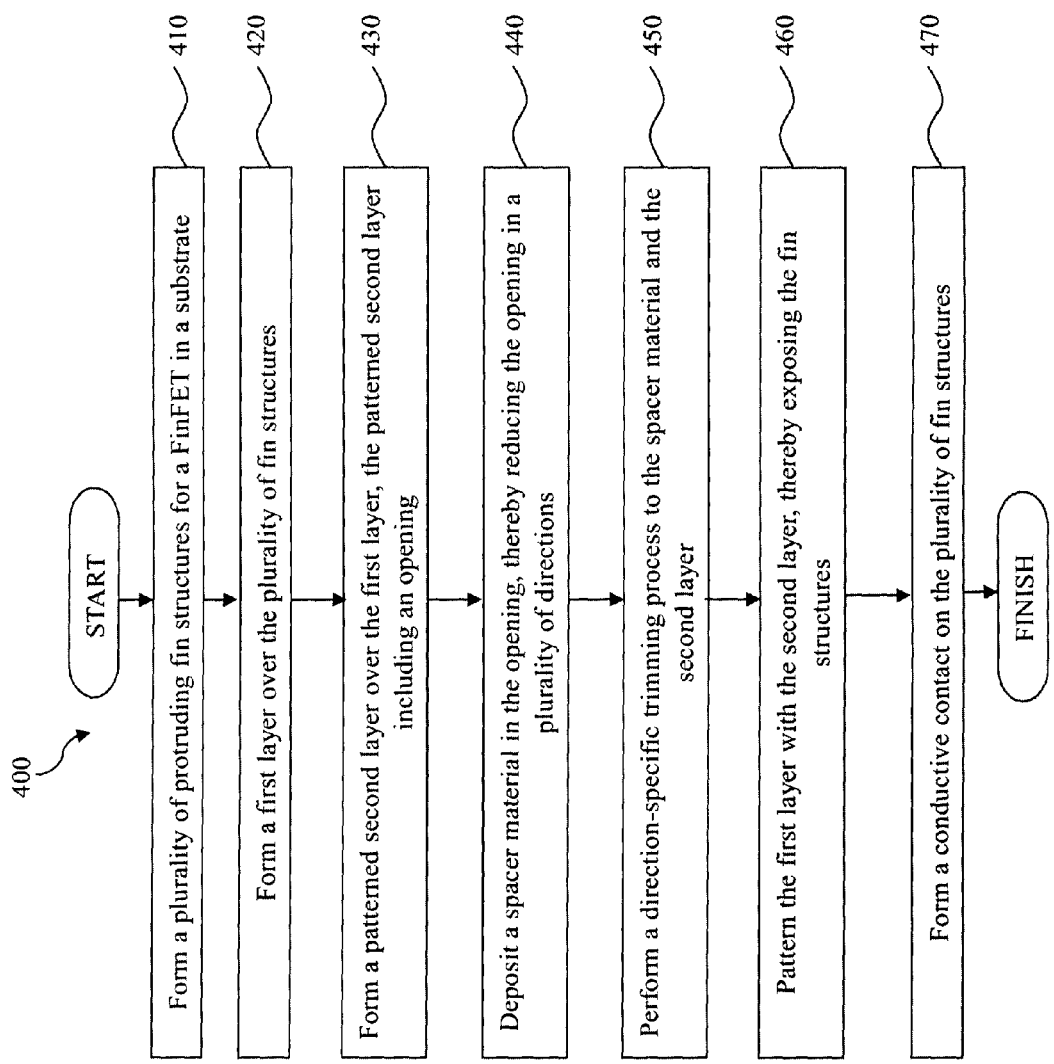
FIGS. 21-23 are flowcharts of example methods for fabricating a semiconductor device in accordance with aspects of the present disclosure.

FIG. 21 is a simplified flowchart illustrating a method 400 of fabricating a semiconductor device according to various aspects of the present disclosure. The method 400 includes a step 410, in which a plurality of protruding fin structures is formed for a FinFET in a substrate. The method 400 includes a step 420, in which a first layer is formed over the substrate. The method 400 includes a step 430, in which a patterned second layer is formed over the first layer. The patterned second layer including an opening. The method 400 includes a step 440, in which a spacer material is deposited in the opening, thereby reducing the opening in a plurality of directions. The method 400 includes a step 450, in which a direction-specific trimming process is performed to the spacer material and the second layer. In some embodiments, the direction-specific trimming process is performed so that it enlarges the opening in a first direction but maintains the opening in a second direction different from the first direction. In some embodiments, the direction-specific trimming process includes a plasma treatment process that is performed with a predefined tilt angle. The method 400 includes a step 460, in which the first layer is patterned with the second layer, thereby exposing the fin structures. The method 400 includes a step 470, in which a conductive contact is formed on the plurality of fin structures. It is understood that additional steps may be performed before, during, or after the steps 410-470. For example, the method 400 may include a step of adjusting a trimming direction and a trimming amount of the direction-specific trimming process by Advanced Process Control (APC). Other additional steps are not illustrated herein for reasons of simplicity.

Figure 22:
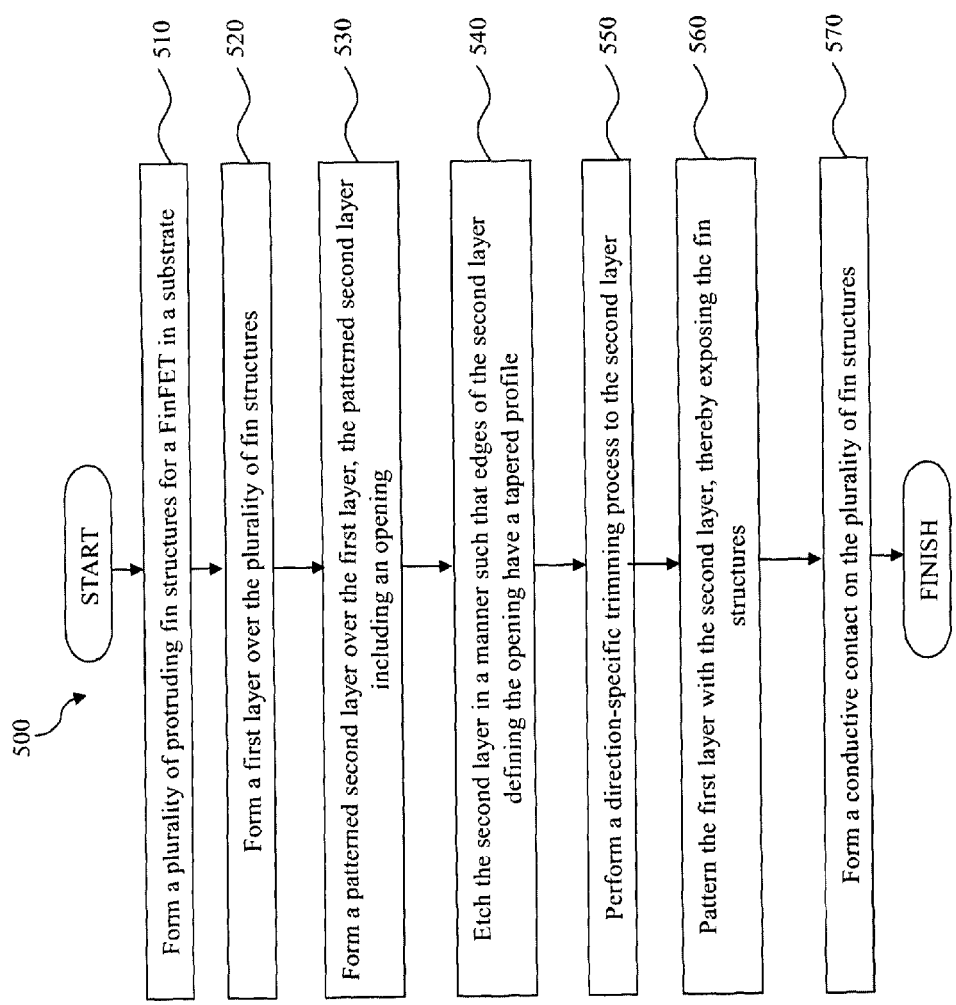

FIG. 22 is a simplified flowchart illustrating a method 500 of fabricating a semiconductor device according to various aspects of the present disclosure. The method 500 includes a step 510, in which a plurality of protruding fin structures is formed for a FinFET in a substrate. The method 500 includes a step 520, in which a first layer is formed over the substrate. The method 500 includes a step 530, in which a patterned second layer is formed over the first layer. The patterned second layer including an opening. The method 500 includes a step 540, in which the second layer is etched in a manner such that the edges of the second layer defining the opening have a tapered profile. The method 500 includes a step 550, in which a direction-specific trimming process is performed to the second layer. In some embodiments, the direction-specific trimming process is performed so that it enlarges the opening in a first direction but maintains the opening in a second direction different from the first direction. In some embodiments, the direction-specific trimming process includes a plasma treatment process that is performed with a predefined tilt angle. The method 500 includes a step 560, in which the first layer is patterned with the second layer, thereby exposing the fin structures. The method 500 includes a step 570, in which a conductive contact is formed on the plurality of fin structures. It is understood that additional steps may be performed before, during, or after the steps 510-570. For example, the method 500 may include a step of adjusting a trimming direction and a trimming amount of the direction-specific trimming process by Advanced Process Control (APC). Other additional steps are not illustrated herein for reasons of simplicity.

Figure 23:
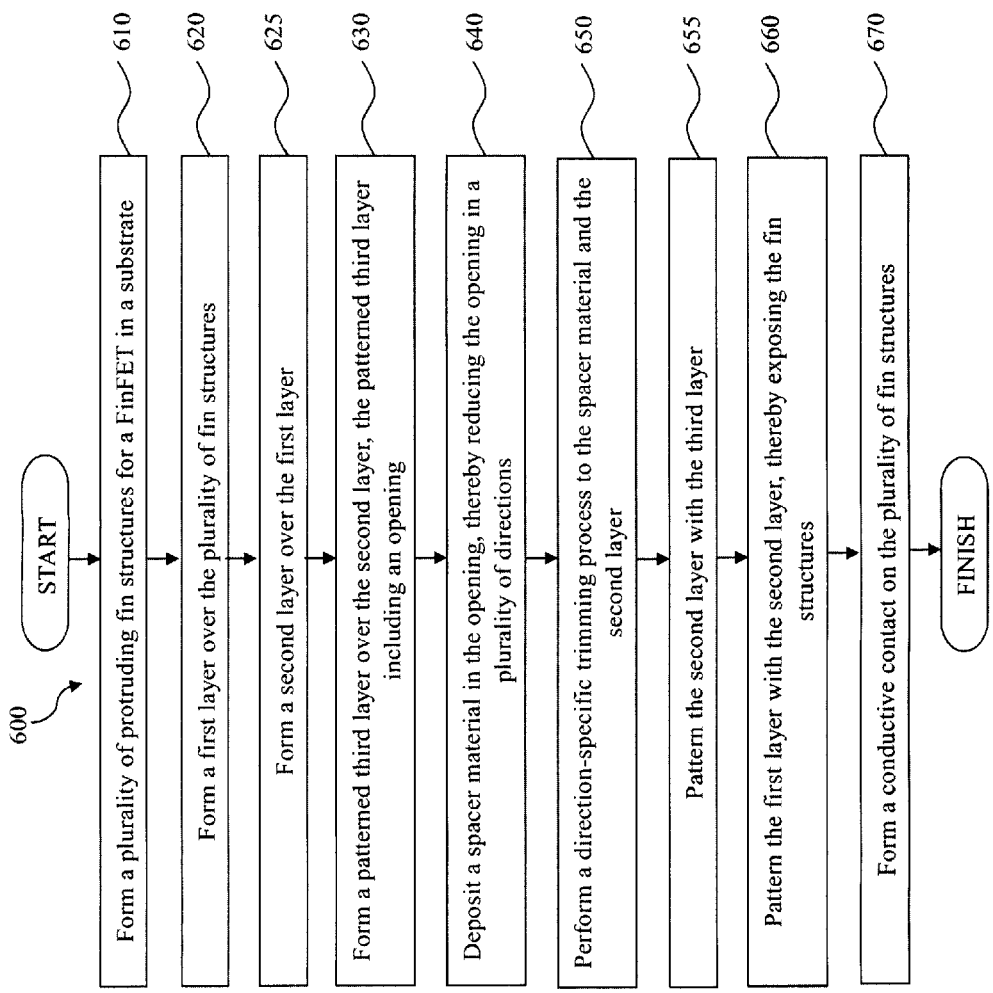

FIG. 23 is a simplified flowchart illustrating a method 400 of fabricating a semiconductor device according to various aspects of the present disclosure. The method 400 includes a step 610, in which a plurality of protruding fin structures is formed for a FinFET in a substrate. The method 600 includes a step 620, in which a first layer is formed over the substrate. The method 600 includes a step 625, in which a second layer is formed over the first layer. The method 600 includes a step 630, in which a patterned third layer is formed over the second layer. The patterned second layer including an opening. The method 600 includes a step 640, in which a spacer material is deposited in the opening, thereby reducing the opening in a plurality of directions. The method 600 includes a step 650, in which a direction-specific trimming process is performed to the spacer material and the second layer. In some embodiments, the direction-specific trimming process is performed so that it enlarges the opening in a first direction but maintains the opening in a second direction different from the first direction. In some embodiments, the direction-specific trimming process includes a plasma treatment process that is performed with a predefined tilt angle. The method 600 includes a step 655, in which the second layer is patterned with the third layer. The method 600 includes a step 660, in which the first layer is patterned with the second layer, thereby exposing the fin structures. The method 600 includes a step 670, in which a conductive contact is formed on the plurality of fin structures. It is understood that additional steps may be performed before, during, or after the steps 610-670. For example, the method 600 may include a step of adjusting a trimming direction and a trimming amount of the direction-specific trimming process by Advanced Process Control (APC). Other additional steps are not illustrated herein for reasons of simplicity.

The various embodiments of the present disclosure discussed herein offer several advantages, it being understood that not all advantages are necessarily discussed herein, other embodiments may offer different advantages, and that no particular advantage is required for any embodiment.

One advantage of the present disclosure is that it improves contact overlay control. By performing a dimension-specific trimming process as discussed above with reference to FIGS. 5 and 10, the contact opening may be enlarged in a specifically chosen direction, but not in other directions. Consequently, fin structures that previously would not have been able to make electrical connections with the contact (as they are not located below the smaller initial contact opening) can now make sufficient electrical connections with the enlarged contact.

Another advantage of the present disclosure is that it accomplishes the improved overlay control without sacrificing critical dimensions (CD) control. As discussed above, the direction-specific trimming process is performed such that the contact opening is enlarged in the Y-direction but does not have to be enlarged in the X-direction. By doing so, the present disclosure preserves the small CD sizes in the X-direction.

Yet another advantage of the present disclosure is that the steps are simple and easy to perform and are compatible with current process flow. In addition, it eliminates some processing steps that would have been required in conventional fabrication processes, thereby saving time and costs.

One aspect of the present disclosure involves a method of fabricating a semiconductor device. The method includes: forming a first layer over a substrate; forming a patterned second layer over the first layer, the patterned second layer including an opening; depositing a spacer material in the opening, thereby reducing the opening in a plurality of directions; performing a direction-specific trimming process to the spacer material and the second layer; and thereafter patterning the first layer with the second layer.

Another aspect of the present disclosure involves a method of fabricating a semiconductor device. The method includes: forming a first layer over a substrate; forming a patterned second layer over the first layer, the patterned second layer including an opening; etching the second layer in a manner such that edges of the second layer defining the opening have a tapered profile; performing a direction-specific trimming process to the second layer; and thereafter patterning the first layer with the second layer.

Yet another aspect of the present disclosure involves a method of fabricating a semiconductor device. The method includes: forming a first layer over a substrate; forming a second layer over the first layer; forming a patterned third layer over the second layer, the third layer including an opening; depositing a spacer material in the opening, thereby reducing the opening in a plurality of directions; performing a direction-specific trimming process to the spacer material; thereafter patterning the second layer with the third layer; and patterning the first layer with the second layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
forming a first layer over a top surface of a substrate;
forming a second layer over the first layer;
etching the second layer to form an opening in the second layer in a manner such that the opening of the second layer tapers from a first width;
performing a direction-specific trimming process to the second layer,
wherein the direction-specific trimming process removes material from the second layer faster along a first direction than along a second direction that is perpendicular to the first direction, and
wherein the first direction and the second direction are each parallel to the top surface of the substrate; and
thereafter patterning the first layer with the second layer.

2. The method of claim 1, further comprising: adjusting a trimming direction and a trimming amount of the direction-specific trimming process by Advanced Process Control (APC).

3. The method of claim 1, wherein the direction-specific trimming process includes a plasma treatment process that is performed with a predefined tilt angle.

4. The method of claim 1, wherein the direction-specific trimming process is performed so that it enlarges the opening in the first direction but maintains the opening in the second direction.

5. The method of claim 1, further comprising, before the forming the first layer: forming a plurality of fin structures of a FinFET in the substrate before the forming of the first layer, wherein the first layer is disposed over the plurality of fin structures.

6. The method of claim 5, wherein the patterning the first layer exposes the plurality of fin structures; and further comprising: forming a conductive contact on the plurality of fin structures.

7. A method of fabricating a semiconductor device, the method comprising:
receiving a substrate having a fin structure extending therefrom, wherein the fin structure extends on the substrate along a first axis and along a second axis perpendicular to the first axis wherein the first axis and the second axis are parallel to a top surface of the substrate;
forming a first layer over the substrate and over the fin structure;
forming a second layer over the first layer, wherein the second layer includes an opening disposed directly above the fin structure; and
performing a directional removal process on the second layer whereby the opening is enlarged more along the first axis than along the second axis.

8. The method of claim 7 further comprising patterning the first layer based on the second layer to expose a portion of the fin structure underlying the opening.

9. The method of claim 8 further comprising depositing a conductive material within the first layer in electrical contact with the portion of the fin structure.

10. The method of claim 8,
wherein the fin structure is a first fin structure,
wherein the substrate further includes a second fin structure extending therefrom, and
wherein the conductive material is in electrical contact with both the first fin structure and the second fin structure.

11. The method of claim 7, wherein the fin structure extends on the substrate further along the first axis than along the second axis.

12. The method of claim 7, wherein the performing of the directional removal process includes performing a tilt-angle plasma treatment process.

13. The method of claim 7, wherein at least one of a trimming direction or a trimming amount of the directional removal process is determined based on an Advanced Process Control (APC).

14. A method of fabricating a semiconductor device, the method comprising:
receiving a substrate having a top surface and having a plurality of fins disposed on the top surface;
forming a first material layer over the substrate and over the plurality of fins;
forming a second material layer over the first layer;
etching an opening in the second material layer, wherein the opening is disposed directly over each fin of the plurality of fins; and
selectively etching the second material layer to enlarge the opening along a first direction that is parallel to the top surface and that is perpendicular to each fin of the plurality of fins without enlarging the opening along a second direction that is parallel to the top surface and perpendicular to the first direction.

15. The method of claim 14, wherein the second direction is a gate length direction.

16. The method of claim 14 further comprising: patterning the first material layer to transfer the opening from the second material layer to the first material layer.

17. The method of claim 16 further comprising depositing a conductive material within the first material layer after the patterning of the first material layer, wherein the conductive material is electrically coupled to each fin of the plurality of fins.

18. The method of claim 14 wherein the selectively etching of the second material layer includes performing a tilt-angle plasma treatment process.

19. The method of claim 14, wherein each fin of the plurality of fins is longer in the second direction than in the first direction.

20. The method of claim 14, wherein at least one of a trimming direction or a trimming amount of the selectively etching of the second material layer is determined based on an Advanced Process Control (APC).

* * * * *